United States Patent
Zeender et al.

(10) Patent No.: US 12,260,031 B1
(45) Date of Patent: Mar. 25, 2025

(54) HUBLESS SCROLL WHEEL

(71) Applicant: Logitech Europe S.A., Lausanne (CH)

(72) Inventors: Léo Zeender, Lausanne (CH);
Jean-Claude Dunant, Fey (CH);
Frédéric Alexis Guillaume de Goumoëns, Vaud (CH)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 18/498,276

(22) Filed: Oct. 31, 2023

(51) Int. Cl.
*G06F 3/0362* (2013.01)
*G01R 33/07* (2006.01)
*G06F 3/01* (2006.01)
*G06F 3/0354* (2013.01)

(52) U.S. Cl.
CPC ......... *G06F 3/0362* (2013.01); *G01R 33/072* (2013.01); *G06F 3/016* (2013.01); *G06F 3/03543* (2013.01)

(58) Field of Classification Search
CPC .... G06F 3/0362; G06F 3/016; G06F 3/03543; G01R 33/072
See application file for complete search history.

(56) References Cited

U.S. PATENT DOCUMENTS

| | | |
|---|---|---|
| 6,492,976 B1 | 12/2002 | Wang et al. |
| 11,625,112 B1 | 4/2023 | Pan et al. |
| 2009/0122012 A1 | 5/2009 | Bohn |
| 2013/0027308 A1 | 1/2013 | Peng |
| 2017/0262083 A1* | 9/2017 | Huang ............... G06F 3/016 |
| 2018/0149497 A1* | 5/2018 | Shen ................ G01P 3/486 |
| 2018/0275776 A1 | 9/2018 | Li et al. |
| 2020/0004346 A1* | 1/2020 | Vlasov ............. H01F 7/0226 |

OTHER PUBLICATIONS

U.S. Appl. No. 18/498,288, "Non-Final Office Action", Oct. 16, 2024, 10 pages.

* cited by examiner

*Primary Examiner* — Sanghyuk Park
(74) *Attorney, Agent, or Firm* — Kilpatrick Townsend & Stockton LLP

(57) ABSTRACT

A hubless scroll wheel for a computer peripheral device may include a wheel defining an open interior. The wheel may include a plurality of contactless indexing features positioned at different angular positions. The scroll wheel may include at least one fixed contactless ratchet member disposed within the open interior of the wheel. The wheel may be rotatable relative to the fixed contactless ratchet members. Each contactless indexing feature and fixed contactless rachet member may include one or both of a magnet and a ferromagnetic material. fixed contactless rachet members may be configured to interact with the contactless indexing features to produce a tactile response as the wheel is rotated. The scroll wheel may include at least one sensor that is configured to detect a magnitude and direction of rotation of the wheel relative to the fixed contactless ratchet members.

20 Claims, 13 Drawing Sheets

HUBLESS SCROLL WHEEL

BACKGROUND OF THE INVENTION

Peripheral devices, such as keyboards and computer mice, often include scroll wheels that enable a user to control the scrolling of a display of a computing device. Conventional scroll wheels include a solid central hub that enables the scroll wheel to rotate about a central axis. Traditional scroll wheels may operate using mechanical actuators that provide haptic feedback to users, as well as that work with sensors to detect a direction, speed, and/or magnitude of rotation of the scroll wheel. Additionally, such hubs may take up space that may be otherwise utilized by other components that provide additional functions and/or aesthetic features to the peripheral device. Therefore, improvements in the design of scroll wheels for computer peripheral devices are desired.

BRIEF SUMMARY OF THE INVENTION

Hubless scroll wheels for a computer peripheral device may include a wheel defining an open interior. The wheel may include a plurality of contactless indexing features positioned at different angular positions about the wheel. The scroll wheels may include at least one fixed contactless ratchet member disposed proximate the wheel. The wheel may be rotatable relative to the at least one fixed contactless ratchet member. Each of the plurality of contactless indexing features and the at least one fixed contactless rachet member may include one or both of a magnet and a ferromagnetic material. The at least one fixed contactless rachet member may be configured to interact with the plurality of contactless indexing features to produce a tactile response as the wheel is rotated relative to the at least one fixed contactless ratchet member. The scroll wheels may include at least one sensor that is configured to detect a magnitude and direction of rotation of the wheel relative to the at least one sensor.

In some embodiments, each of the plurality of contactless indexing features may include a magnet. Each of the at least one fixed contactless ratchet member may include a ferromagnetic element. Each ferromagnetic element may include a ferromagnetic pin that is rotatable about a pin axis. Poles of each magnet may be oriented in a same radial direction relative to an axis of rotation of the wheel. Poles of each magnet on a first half of the wheel may be oriented in a first radial direction relative to an axis of rotation of the wheel and poles of each magnet on a second half of the wheel may be oriented in a second radial direction relative to an axis of rotation of the wheel. The at least one sensor may include a Hall sensor. Each of the plurality of contactless indexing features may include a ferromagnetic tooth. Each of the at least one fixed contactless ratchet member may include a magnet. The magnet may include a first ferromagnetic member disposed at an end of a first pole of the magnet and a second ferromagnetic member disposed at an end of a second pole of the magnet. Distal ends of the first ferromagnetic member and the second ferromagnetic member may have widths that substantially match a width of each ferromagnetic tooth. The at least one sensor may include at least one of an optical sensor, an inductive sensor, a capacitive sensor, or a resistive sensor.

Some embodiments of the present technology may encompass peripheral devices. The devices may include a housing. The devices may include at least one fixed contactless ratchet member coupled with the housing. The devices may include a wheel mount. The devices may include a wheel rotatably coupled with the wheel mount. The wheel may define an open interior within which the at least one fixed contactless ratchet member is disposed. The wheel may include a plurality of contactless indexing features positioned at different angular positions about the wheel. The wheel may be rotatable relative to the at least one fixed contactless ratchet member. Each of the plurality of contactless indexing features and the at least one fixed contactless rachet member may include one or both of a magnet and a ferromagnetic material. The at least one fixed contactless rachet member may be configured to interact with the plurality of contactless indexing features to produce a tactile response as the wheel is rotated relative to the at least one fixed contactless ratchet member. The devices may include at least one sensor that is configured to detect a magnitude and direction of rotation of the wheel.

In some embodiments, at least a portion of the open interior may extend beyond an outer surface of the housing. Each of the plurality of contactless indexing features may include a magnet. Each of the at least one fixed contactless ratchet member may include a ferromagnetic pin. Poles of each magnet may be oriented to create an attractive force with each ferromagnetic pin when the magnet is aligned with one of the ferromagnetic pins. The ferromagnetic pins may contact an inner surface of the wheel. The at least one fixed contactless rachet member may include only two ferromagnetic pins that are disposed within 180 degrees of one another. The two ferromagnetic pins may be disposed within an upper half of the open interior of the wheel.

Some embodiments of the present technology may encompass hubless scroll wheels for a computer peripheral device. The scroll wheels may include a wheel defining an open interior. The scroll wheels may include a plurality of contactless indexing features positioned at different angular positions about the wheel. The scroll wheels may include at least one fixed contactless ratchet member disposed proximate the wheel. The wheel may be rotatable relative to the at least one fixed contactless ratchet member. Each of the plurality of contactless indexing features and the at least one fixed contactless rachet member may include one or both of a magnet and a ferromagnetic material. The at least one fixed contactless rachet member may be configured to interact with the plurality of contactless indexing features to produce a tactile response as the wheel is rotated relative to the at least one fixed contactless ratchet member. The scroll wheels may include at least one sensor that is configured to detect a magnitude and direction of rotation of the wheel relative to the at least one sensor.

In some embodiments, the at least one fixed contactless ratcheting member may be coupled with the wheel. Each of the plurality of contactless indexing features may include a magnet. Each of the at least one fixed contactless ratchet member may include an arcuate member that includes a plurality of teeth. Each of the plurality of contactless indexing features may include a magnet. Each of the at least one fixed contactless ratchet member may include a ferromagnetic member. Poles of circumferentially adjacent magnets may be oriented in opposite radial directions relative to an axis of rotation of the wheel. Each of the plurality of contactless indexing features may include a magnet. Poles of each magnet may be parallel to a rotational axis of the wheel. Each of the at least one fixed contactless ratchet member may include a ferromagnetic member that is disposed laterally outward of the plurality of contactless indexing features.

BRIEF DESCRIPTION OF THE DRAWINGS

A further understanding of the nature and advantages of the disclosed technology may be realized by reference to the remaining portions of the specification and the drawings.

Figure 1:
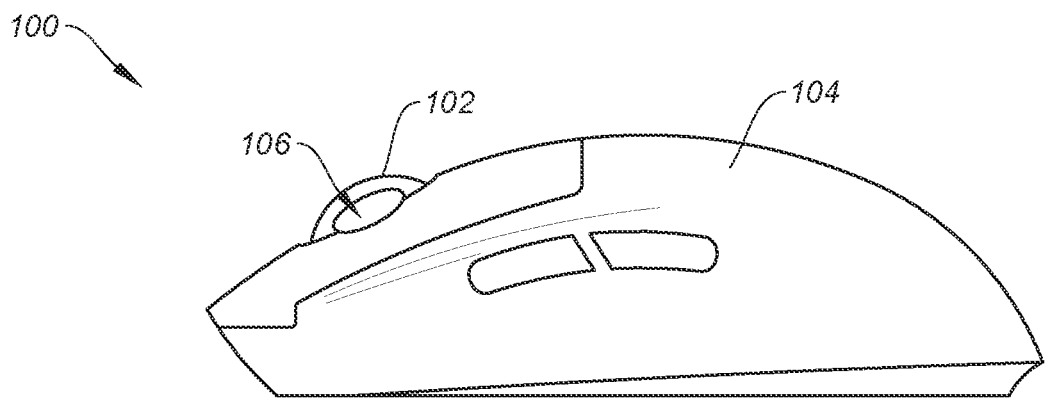
FIG. 1 illustrates a side elevation view of a computer mouse according to embodiments of the present invention.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention are directed to hubless scroll wheels for peripheral devices that may be used with personal computers, tablets, smart phones, e-readers, and/or other computing devices. Peripheral devices that include such scroll wheels may include, without limitation, keyboards, computer mice, web cameras, and/or other devices that may be used to provide inputs for one or more computing devices. The hubless scroll wheels described herein may include components that provide a ratchet feel to provide haptic feedback to a user, as well as to enable the scroll wheel to be held in a given angular position when no rotational force is applied by a user. In some embodiments, the ratchet feel (or other mechanical feel) may be provided by contactless ratchet mechanisms, which may use magnetic forces to simulate mechanical ratchet mechanisms. The hubless scroll wheels described herein may include one or more sensors that may detect the direction, magnitude, and/or speed of rotation of the scroll wheels, which may enable the scroll wheels to be used as input devices for peripheral devices. For example, the hubless scroll wheels described herein may enable a user to scroll up or down on a display of a connected computing device.

Hubless scroll wheels may reduce or eliminate the need for mechanical actuators and/or other mechanical interactions that may result in mechanical wear of the peripheral device. Additionally, hubless scroll wheels may provide room to accommodate additional components within some of the space typically occupied by a hub. For example, lights may be inserted within the open interior of the hubless scroll wheel to enhance the aesthetic appeal of the peripheral device.

While referred to as a scroll wheel, it will be appreciated that the scroll wheels of the present invention may be used to provide other inputs in which a direction and degree of rotation may provide an input to a computer device. For example, the scroll wheels described herein may be used as dials to control various functions, such as volume, brightness, zoom, color adjustments (such as for a red, green, blue (RGB) peripheral device), and/or other adjustable properties.

Turning now to FIG. 1, an embodiment of a peripheral device 100 having a hubless scroll wheel 102 is illustrated. As illustrated, peripheral device 100 is a computer mouse, however hubless scroll wheel 102 may be incorporated into other types of peripheral devices such as, but not limited to, keyboards, web cameras, and the like. The peripheral device 100 may include a housing 104, which may form an exterior of the peripheral device 100. Hubless scroll wheel 102 may define an open interior 106. Hubless scroll wheel 102 may be coupled with the housing 104 such that at least a portion of the open interior 106 extends beyond an outer surface of the housing 104. This may enable a user to see through the open interior 106 of the hubless scroll wheel 102 when viewing the peripheral device 100 from a side of the peripheral device 100. In some embodiments, the housing 104 may be designed to expose a greater amount of the open interior 106. For example, the housing 104 may include cutouts, dimples, and/or other tapered regions proximate the hubless scroll wheel 102 that may enable a greater portion of the open interior 106 to be visible from an outside of the housing 104.

Figure 2:
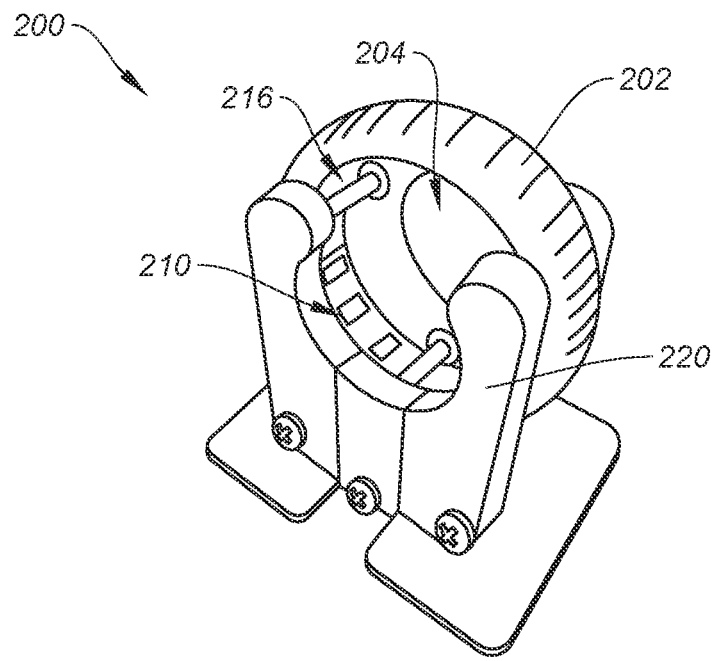
FIG. 2 illustrates an isometric view of a hubless scroll wheel according to embodiments of the present invention.
Figure 2A:
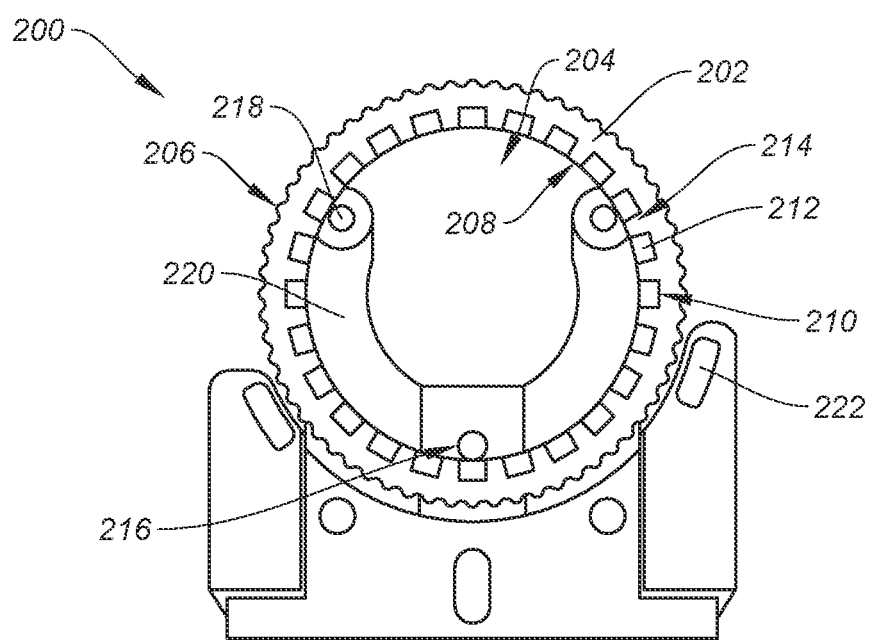
FIG. 2A illustrates a partial cross-sectional side elevation view of the hubless scroll wheel of FIG. 2.

FIGS. 2 and 2A illustrate one embodiment of a hubless scroll wheel 200. Hubless scroll wheel 200 may be used in a peripheral device, such as hubless scroll wheel 102 in peripheral device 100 described above. Hubless scroll wheel 200 may include a wheel 202 that defines an open interior 204. For example, the wheel 202 may be annular and may include an outer surface 206 and an inner surface 208, with the inner surface 208 defining a periphery of the open interior 204. In some embodiments, a diameter of the inner surface 208 may be at least 50% of a diameter of the outer surface 206, at least 60% of the diameter of the outer surface 206, at least 70% of the diameter of the outer surface 206, at least 80% of the diameter of the outer surface 206, at least 90% of the diameter of the outer surface 206, or more, with larger percentages resulting in a thinner wheel 202 having a larger open interior 204. Outer surface 206 may include a texture, such as radially aligned ridges, knurling, and/or other texture in some embodiments. In some embodiments, wheel 202 may be formed from multiple layers of material. For example, the wheel 202 may have at least one rigid structural layer, which may be formed from plastic, metal, ceramic, and/or other rigid material. Outer surface 206, for example, may be formed from an elastomeric material, which provides a softer and/or grippier surface for the user to manipulate the hubless scroll wheel 200. Additional layers may be provided in some embodiments. In the illustrated embodiment, inner surface 208 is generally smooth, however in other embodiments, the inner surface 208 may include one or more teeth, protrusions, and/or other roughened textures.

Hubless scroll wheel 200 may include a number of indexing features 210, as best shown in FIG. 2A. Indexing features 210 may be used to provide haptic feedback to the user as the wheel 202 is rotated. For example, as will be discussed in greater detail below, interactions between the indexing features 210 and additional components of the hubless scroll wheel 200 may generate forces that may mimic the clicking or ratcheting of a conventional scroll wheel. Indexing features 210 may also be used by the hubless scroll wheel 200 and/or an associated peripheral device to track a direction, speed, and/or magnitude of rotation of the hubless scroll wheel 200, which may enable the hubless scroll wheel 200 to be used to provide inputs to a connected computing device. Each indexing feature 210 may be positioned at a different angular position about the wheel 202. The indexing features 210 may be disposed at regular or irregular intervals about the wheel 202. To provide uniform haptic feedback, the indexing features 210 are provided at regular angular intervals in the illustrated embodiment. Any number of indexing features 210 may be utilized, with greater numbers of indexing features 210 providing greater number of ratchet locations. For example, the wheel 202 may include at least 10 indexing features, at least 12 indexing features, at least 14 indexing features, at least 16 indexing features, at least 18 indexing features, at least 20 indexing features, at least 22 indexing features, at least 24 indexing features, at least 26 indexing features, at least 28 indexing features, at least 30 indexing features, or more.

In the present embodiment, each indexing feature 210 is a contactless indexing feature. As used herein, the term "contactless" may refer to the force interaction that generates haptic feedback during rotation of the hubless scroll wheel 20. Thus, in some instances contactless features of the hubless scroll wheels described herein may slide against or otherwise contact other components of the hubless scroll wheel, but the ratcheting feel or other haptic feedback is generated as a result of non-contact forces, such as magnetic forces. The indexing features 210 may form a portion of the inner surface 208, outer surface 206, and/or embedded within wheel 202 between the inner surface 208 and outer surface 206. In the illustrated embodiment, each indexing feature 210 may be or include a magnet 212. Each magnet 212 may have the same size in some embodiments, however variations are possible. The magnets 212 may be positioned about the annulus of wheel 202 with adjacent magnets 212 being separated from one another via a gap 214. As illustrated, the magnets 212 are wider than the gaps 214, although the gaps may be as wide or wider than magnets 212 in some embodiments. In the illustrated embodiment, poles of each magnet 212 are oriented in a same radial direction relative to an axis of rotation of the wheel. For example, the north pole of each magnet 212 may face the axis of rotation of the wheel 202 while the south pole of each magnet 212 may face away from the axis of rotation of the wheel 202. In other embodiments, the north pole of each magnet 212 may face away from the axis of rotation of the wheel 202 while the south pole of each magnet 212 may face the axis of rotation of the wheel 202. Other arrangements of the poles of the magnets 212 may be possible in various embodiments. For example, poles of circumferentially adjacent magnets 212 may alternate in orientation (e.g., every other magnet 212 has a north pole facing the axis of rotation or facing away from the axis of rotation) such that poles of circumferentially adjacent magnets 212 are oriented in opposite radial directions relative to the axis of rotation of the wheel 202.

Hubless scroll wheel 200 may include one or more ratchet members 216. The ratchet members 216 may be disposed proximate the wheel 202, such as within the wheel 202 and/or outside of the wheel 202 (e.g., radially beyond an outer surface of the wheel 202 and/or alongside a lateral side of the wheel 202). For example, in the illustrated embodiment the ratchet members 216 are disposed within the open interior 204 of the wheel 202 and may be positioned to interact with the indexing features 210 to provide haptic feedback as the wheel 202 is rotated and/or to hold the wheel 202 at a given rotational position when no rotational force is applied by a user. In some embodiments, the ratchet members 216 may be contactless. For example, the interactions between the ratchet members 216 and the indexing features 210 that produce the haptic feedback may be the result of non-contact forces (such as magnetic forces) rather than physical or mechanical forces, although there may be contact (such as sliding contact) between the ratchet members 216 and the indexing features 210. In the present embodiment, the ratchet members 216 include ferromagnet elements, such as ferromagnetic pins 218 that are positioned at different angular locations about the inner surface 208 of wheel 202. The pins 218 may be positioned at regular or irregular intervals about the wheel 202. Hubless scroll wheel 200 may include two or more pins, three or more pins, four or more pins, five or more pins, or six or more pins. In some embodiments, the pins 218 may be arranged about the open interior 204 such that at any given angular position of the wheel 202, either all pins 218 are radially aligned with a magnet 212 or no pins 218 are aligned with a magnet 212. Such a design may enhance the ratchet feel and ability to hold the wheel 202 in a given rotational position as will be discussed in greater detail below. The pins 218 may be formed from a ferromagnetic material that is attracted to the magnets 212. The pins 218 may contact inner surface 208 to help support wheel 202 in a given position relative to the housing of a peripheral device, while still permitting rotation of the wheel 202. For example, two or more pins 218 may be positioned against the inner surface 208 to prevent the wheel from moving laterally relative to a rotational axis of the wheel 202. In some embodiments, each pin 218 is rotatable about a pin axis, while in other embodiments each pin 218 is rotationally fixed.

As the wheel 202 is rotated relative to the ratchet members 216, the pins 218 may be attracted to the magnets 212 as the magnets 212 pass in close proximity to the pins 218. The presence of gaps 214 between adjacent magnets 212 may enable the hubless scroll wheel 200 to deliver haptic feedback that mimics a clicking or ratcheting feel of a traditional mechanical scroll wheel. For example, as the wheel 202 is rotated, each pin 218 is alternatingly aligned with one of the magnets 212 followed by a respective gap 214. As noted above, the pins 218 may be arranged such that either all pins 218 or no pins 218 are aligned with respective magnets 212 at a given rotational position of the wheel 202, which may enable the attractive forces between magnets 212 and pins 218 to be synchronized such that a greatest attractive force occurs when each pin 218 is aligned with one of the magnets 212 and a lowest attractive force occurs when each pin 218 is aligned with one of the gaps 214. When the attractive force is lowest, a user may feel little to no resistance to rotational motion of the wheel 202, while a greater resistance will be felt when the attractive force is greatest. The alternating forces generated by the magnets 212 and gaps 214 may therefore provide a repeating ratchet feel as the wheel 202 is rotated relative to the ratchet members 216.

The presence of gaps 214 may also enable the interaction between the magnets 212 and the pins 218 to hold the wheel 202 in a given rotational position in the absence of rotational force applied by a user. For example, when no user force is applied to the wheel 202, magnetic force from a magnet 212 nearest to each pin 218 may rotate and/or hold the wheel 202 at a position in which the magnet 212 nearest to each pin 218 is radially aligned with the respective pin 218. In the absence of additional user force, the magnetic force between the magnets 212 and pins 218 may hold the wheel 202 at such a rotational position.

The ratchet members 216 may be fixed in position relative to the wheel 202, enabling the wheel 202 to rotate about the ratchet members 216. For example, each ratchet member 216 may be coupled with one or more supports 220. In some embodiments, each ratchet member 216 may have a dedicated support 220, while in other embodiments (such as illustrated here) some or all of the ratchet members 216 share a single support 220 or set of supports 220. For example, as illustrated, hubless scroll wheel 200 includes two supports 220, with one support 220 on either side of the wheel 202. Ends of each pin may be coupled with the supports 220. As illustrated, the two supports 220 maintain three pins 218 are substantially regular angular intervals (e.g., the pins are between about 100 and 140 degrees from one another). The supports 220 may be spaced apart from lateral sides of the wheel 202 in some embodiments, while in other embodiments lateral sides of the wheel 202 may be in contact with one or both supports 220. In some such embodiments, at least a portion of the supports 220 that contact the wheel 202 may be formed from or include a low-friction and/or wear resistant material, such as (but not limited to) polytetrafluoroethylene (PTFE). In some embodiments, the supports 220 may not only support pins 218 or other ratchet members 216, but may also constrain lateral movement of the wheel 202. Supports 220 may be positioned entirely outward of the open interior 204, or a portion of one or more of the supports 220 may extend into the open interior 204.

Each support 220 may be coupled with the housing of a peripheral device and/or a component disposed within the housing. When inner surface 208 of wheel 202 is positioned about the pins 218, the supports 220 effectively fix the wheel 202 at a given position relative to the housing. In some embodiments, a top end of each support 220 may terminate below a top end of the wheel 202. For example, the top of tend of the supports 220 may be disposed below a housing of a peripheral device, such as illustrated in the peripheral device 100 of FIG. 1. Such a design may enable the supports 220 to be hidden within an interior of the housing and may provide a cleaner aesthetic look.

Hubless scroll wheel 200 may include one or more sensors 222 that may be configured to detect a magnitude, speed, and/or direction of rotation of the wheel 202 relative to the ratchet members 216 and housing of the peripheral device. The sensors 222 may take various forms, such as magnetic sensors, optical sensors, capacitive sensors, resistive sensors, and/or inductive sensors, although other sensor types may be used in various embodiments. In the illustrated embodiment, hubless scroll wheel 200 includes two or more Hall sensors that may detect changes in the magnetic field generated by the magnets 212 as wheel 202 is rotated. As illustrated, the Hall sensors are positioned radially outward of the outer surface 206 of wheel 202, such as being positioned on the supports 220, another support member, and/or a portion of the housing of the peripheral device. In other embodiments, the Hall sensors may be positioned alongside the lateral sides of the wheel 202 and/or within the open interior 204 of the wheel 202. By using multiple Hall sensors at different locations, magnitude, speed, and/or direction of rotation of the wheel 202 may be determined based on measured changes of the magnetic field generated by the magnets 212 as the wheel 202 rotates.

While shown with the magnets 212 being mounted on and/or embedded within the wheel 202 and the ratchet members 216 being fixed on the housing and/or otherwise fixed relative to the wheel 202, it will be appreciated that in some embodiments such positioning may be switched such that the ratchet members 216 are disposed on the wheel 202 and the magnets 212 may be fixed on the housing and/or otherwise fixed relative to the wheel 202. In such embodiments, as the magnetic field generated by the magnets 212 is fixed (rather than rotating), rotation of the wheel 202 may be detected using other indexing features 210 that are detectable using one or more sensors. For example, the indexing features 210 may include teeth and/or other protrusions disposed on one or more surfaces (e.g., inner/outer circumferential surface, lateral surfaces, etc.) of the wheel 202 that are detectable using resistive sensors, capacitive sensors, optical sensors, inductive sensors, and the like as will be described in greater detail below. In other embodiments, the sensors may include encoders that are coupled for rotation with the wheel 202. It will be appreciated that other forms of indexing features 210 may be utilized to track the movement of the wheel 202 in various embodiments.

Figure 3:
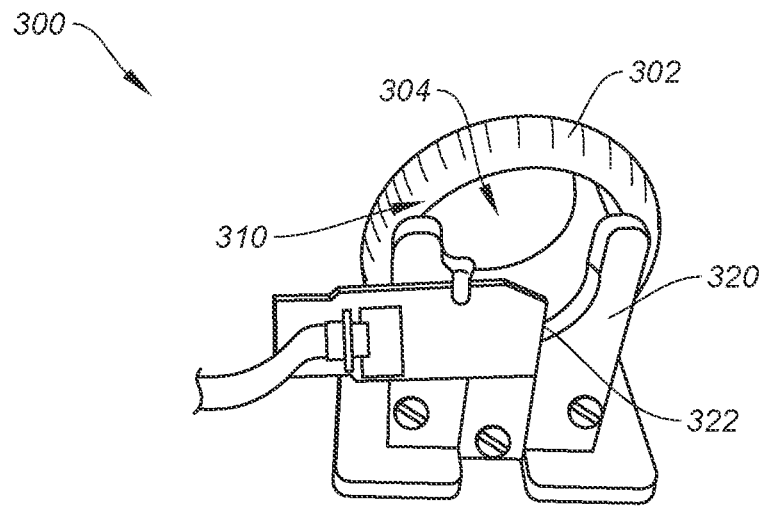
FIG. 3 illustrates an isometric view of a hubless scroll wheel according to embodiments of the present invention.
Figure 3A:
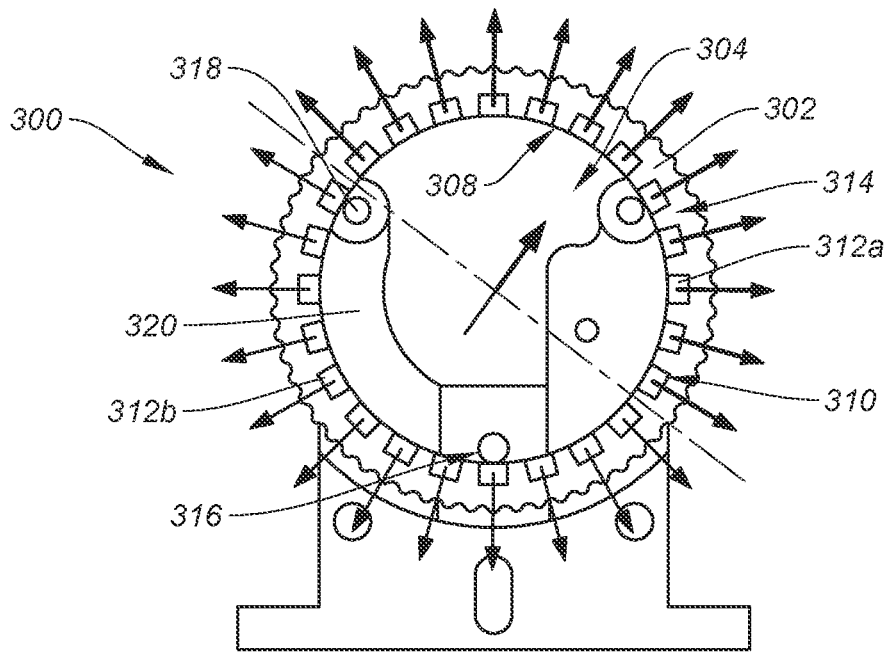
FIG. 3A illustrates a partial cross-sectional side elevation view of the hubless scroll wheel of FIG. 3.

FIGS. 3 and 3A illustrate another embodiment of a hubless scroll wheel 300 in accordance with the present invention. Hubless scroll wheel 300 may be used in a peripheral device, such as peripheral device 100 described above. Hubless scroll wheel 300 may be similar to hubless scroll wheel 200 and may include any feature described in relation to hubless scroll wheel 200. For example, Hubless scroll wheel 300 may include a wheel 302 that defines an open interior 304. A number of indexing features 310, such as magnets 312, may be disposed about the wheel 302 at different angular positions. As illustrated, the magnets 312 are disposed about the wheel 302 at regular angular intervals, with adjacent magnets 312 being separated from one another via gaps 314. In the illustrated embodiment, poles of each magnet 312a on a first half of the wheel 302 are oriented in a first radial direction relative to an axis of rotation of the wheel 302 and poles of each magnet 312 on a second half of the wheel 302 are oriented in a second radial direction relative to the axis of rotation of the wheel 302. For example, the north pole of each magnet 312a may face the axis of rotation of the wheel 302 while the north pole of each magnet 312b may face away from the axis of rotation of the wheel 302. Such an arrangement of the magnets 312 may generate a centered magnetic field that includes a north pole half and a south pole half that are split across the axis of rotation of the wheel 302. This may enable a single Hall sensor to be used as will be discussed in greater detail below.

Hubless scroll wheel 300 may include one or more ratchet members 316, which may be ferromagnetic pins 318 that are positioned at different angular locations about an inner surface 308 of wheel 302. The pins 318 may contact inner surface 308 to help support wheel 302 in a given position relative to the housing of a peripheral device, while still permitting rotation of the wheel 302. As discussed above with respect to FIG. 2, as the wheel 302 is rotated relative to the ratchet members 316, the pins 318 may be attracted to the magnets 312 as the magnets 312 pass in close proximity to the pins 318. The presence of gaps 314 between adjacent magnets 312 may enable the hubless scroll wheel 300 to deliver haptic feedback that mimics a clicking or ratcheting feel of a traditional mechanical scroll wheel. For example, as the wheel 302 is rotated, each pin 318 is alternatingly aligned with one of the magnets 312 followed by a respective gap 314 to produce alternating periods of strong magnetic force and lesser/no magnetic force to provide a repeating ratchet feel as the wheel 302 is rotated relative to the ratchet members 316. The presence of gaps 314 may also enable the interaction between the magnets 312 and the pins 318 to hold the wheel 302 in a given rotational position in the absence of rotational force applied by a user as described above.

The ratchet members 316 may be fixed in position relative to the wheel 302 via one or more supports 320. Hubless scroll wheel 300 may include one or more sensors 322 that may be configured to detect a magnitude, speed, and/or direction of rotation of the wheel 302 relative to the ratchet members 316 and housing of the peripheral device. In the illustrated embodiment, hubless scroll wheel 300 includes a single Hall sensor (although greater numbers may be used in some embodiments) that may detect changes in the collective magnetic field generated by the magnets 312 as wheel 302 is rotated. In particular, one or more Hall sensors may be positioned in alignment with the rotational axis of the wheel 302. Due to the arrangement of the poles of the magnets 312, such positioning may enable one or more Hall sensors to monitor the collective centered magnetic field (e.g., having a north pole half and a south pole half that are split across the axis of rotation of the wheel 302) of the magnets 312. More specifically, the Hall sensor(s) may detect the detect the orientation of the north pole and/or south pole of the collective magnetic field as the wheel 302 rotates, which enables the hubless scroll wheel 300 to determine the magnitude, speed, and/or direction of rotation of the wheel 302.

Figure 4:
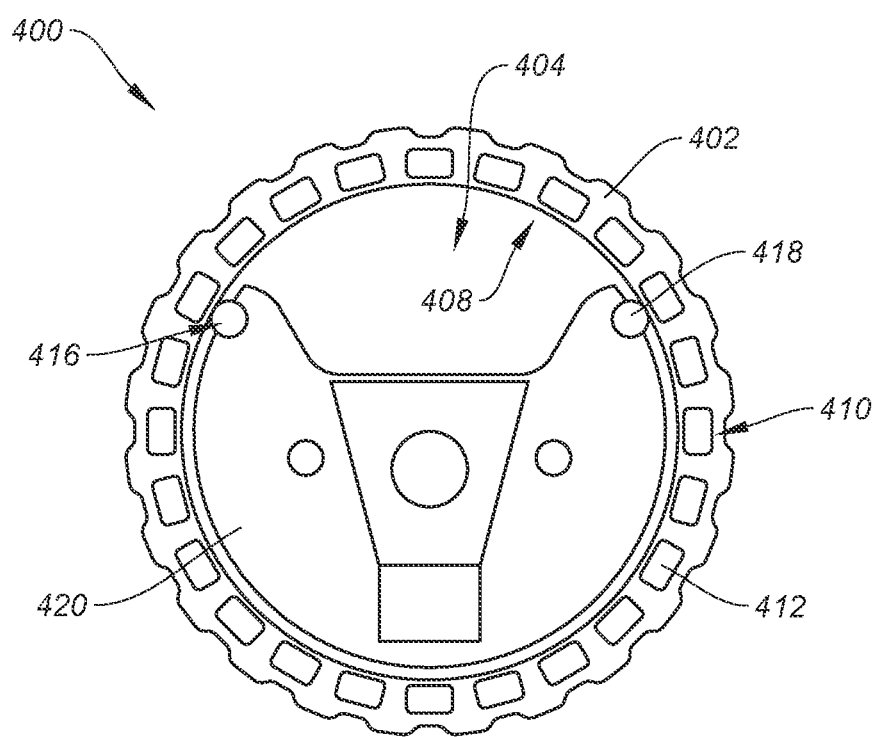
FIG. 4 illustrates a partial cross-sectional side elevation view of a hubless scroll wheel according to embodiments of the present invention.

FIG. 4 illustrates a portion of another embodiment of a hubless scroll wheel 400 in accordance with the present invention. Hubless scroll wheel 400 may be used in a peripheral device, such as peripheral device 100 described above. Hubless scroll wheel 400 may be similar to hubless scroll wheels 200 and 300 and may include any feature described in relation to hubless scroll wheels 200 and 300. For example, hubless scroll wheel 400 may include a wheel 402 that defines an open interior 404. A number of indexing features 410, such as magnets 412, may be disposed about the wheel 402 at different angular positions. As illustrated, the magnets 412 are disposed about the wheel 402 at regular angular intervals, with adjacent magnets 412 being separated from one another via gaps 414. Poles of each magnet 412 may be oriented in different arrangements, including those arrangements described in relation to hubless scroll wheels 200 and 300. Hubless scroll wheel 400 may include one or more ratchet members 416, which may be ferromagnetic pins 418 that are positioned at different angular locations about an inner surface 408 of wheel 402. The pins 418 may contact inner surface 408 to help support wheel 402 in a given position relative to the housing of a peripheral device, while still permitting rotation of the wheel 402. As discussed above with respect to FIG. 2, as the wheel 402 is rotated relative to the ratchet members 416, the pins 418 may be attracted to the magnets 412 as the magnets 412 pass in close proximity to the pins 418. The presence of gaps 414 between adjacent magnets 412 may enable the hubless scroll wheel 400 to deliver haptic feedback that mimics a clicking or ratcheting feel of a traditional mechanical scroll wheel. For example, as the wheel 402 is rotated, each pin 418 is alternately aligned with one of the magnets 412 followed by a respective gap 414 to produce alternating periods of strong magnetic force and lesser/no magnetic force to provide a repeating ratchet feel as the wheel 402 is rotated relative to the ratchet members 416. The presence of gaps 414 may also enable the interaction between the magnets 412 and the pins 418 to hold the wheel 402 in a given rotational position in the absence of rotational force applied by a user as described above.

In the illustrated embodiment, the ratchet members 416 are fixed in position relative to the wheel 402 via one or more holders or supports 420. In particular, hubless scroll wheel 400 includes a central support 420, which may be disposed within the open interior 404 of wheel 402. The central support 420 may hold a number of the pins 418. The central support 420 may extend only to a height of the pins 418 or slightly above the height of the pins 418, thereby leaving a gap between an upper surface of the central support 420 and the top end of the wheel 402. For example, a top end of the central support 420 may extend upward beyond a rotational axis of the wheel by less than 75% of a radius of the wheel 402, by less than 50% of the radius, by less than 25% of the radius, or less. Such a design of the central support 420 may enable the open interior 404 to appear as an air gap when viewed from an exterior of the housing of the peripheral device, such as shown in FIG. 1. In some embodiments, the central support 420 may hold three or more pins 418. However, as illustrated, central support 420 holds two pins 418. Each pin 418 is disposed within an upper half of the open interior 404 and sits against an upper portion of the inner surface 408. The inner support 420 may itself be supported within the housing of a peripheral device by one or more additional supports that are coupled with the housing and/or a component that is disposed within the housing. The inner support 420 may be positioned within the open interior 404 such that the periphery of the inner support 420 is spaced apart from the inner surface 408 of the wheel 402 by a small gap, which may prevent the wheel 402 from rubbing against the inner support 420 as the wheel 402 rotates.

The use of central support 420 may enable only two pins 418 to be used as ratcheting members 416, with the pins 418 being disposed within or about 180 degrees of one another within an upper half of the open interior 404. For example, the magnetic attraction between the magnets 412 and pins 418, along with gravitational force, may pull the wheel 402 downward, with the contact between the inner surface 408 and pins 418 limiting downward movement of the wheel 402 relative to the housing. The wheel 402 is prevented from moving upward by the presence of the central support 420 within open interior 404, as the wheel 402 may only be lifted a short distance before contacting the central support 420. While shown with only two pins 418, central support 420 may include any number of pins in other embodiments. One or more sensors, such as magnetic field sensors, may be used to detect a magnitude, speed, and/or direction of rotation of the wheel 402 as described elsewhere herein.

Figure 5:
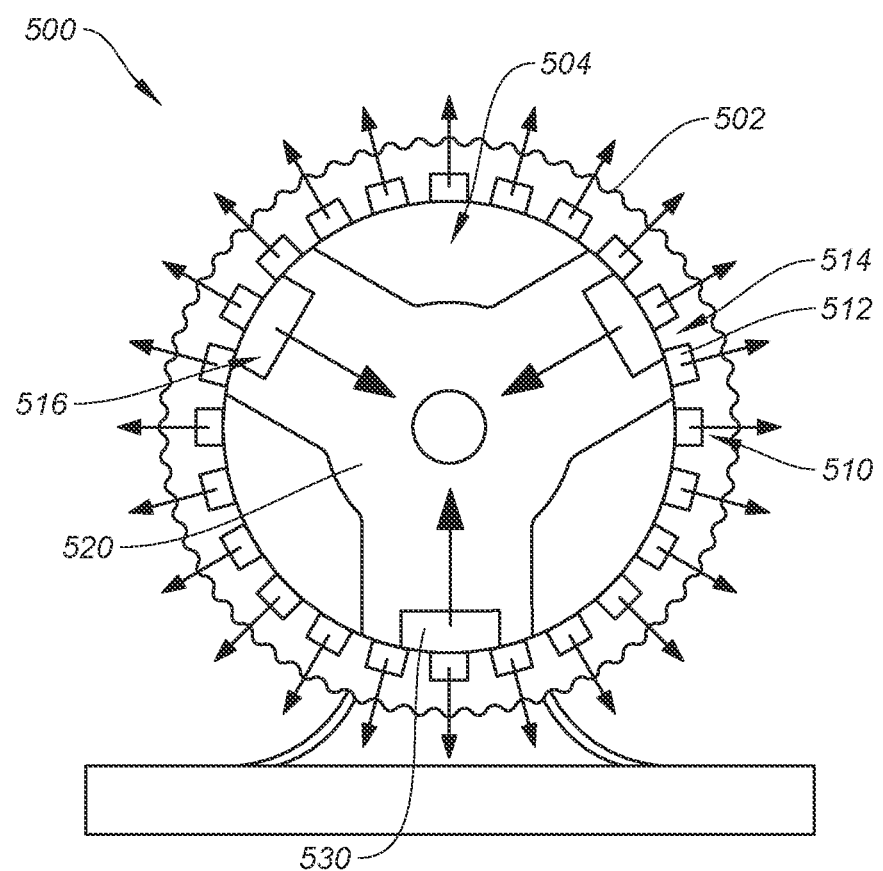
FIG. 5 illustrates a partial cross-sectional side elevation view of a hubless scroll wheel according to embodiments of the present invention.

FIG. 5 illustrates a partial view of a hubless scroll wheel 500 that includes a floating wheel 502. Hubless scroll wheel 500 may be used in a peripheral device, such as peripheral device 100 described above. Hubless scroll wheel 500 may be similar to hubless scroll wheels 200, 300, and 400 and may include any feature described in relation to hubless scroll wheels 200, 300, and 400. For example, Hubless scroll wheel 500 may include a wheel 502 that defines an open interior 504. A number of indexing features 510, such as magnets 512, may be disposed about the wheel 502 at different angular positions. As illustrated, the magnets 512 are disposed about the wheel 502 at regular angular intervals, with adjacent magnets 512 being separated from one another via gaps 514. In the illustrated embodiment, poles of each magnet 512 are oriented in a same radial direction (e.g., all north poles facing the rotational axis of the wheel 502 or all north poles facing away from the rotational axis of the wheel 502).

Hubless scroll wheel 500 may include one or more ratchet members 516, which may be additional magnets 530 that are positioned at different angular locations about an inner surface 508 of wheel 502. For example, as illustrated, three magnets 530 are disposed within the open interior 504 at regular intervals (e.g., 120 degrees), although other numbers of magnets 530 may be used in some embodiments. For example, hubless scroll wheel 500 may include four or more magnets 530, five or more magnets 530, six or more magnets 530, eight or more magnets 530, ten or more magnets 530, or more. The magnets 530 may be arranged at regular angular intervals about the open interior 504, with surfaces of the magnets 530 being spaced apart from the inner surface 508 of the wheel 502. Poles of each magnet 530 may be oriented opposite the poles of magnets 512. For example, when north poles of magnets 512 face the rotational axis of the wheel 502, north poles of the magnets 530 face away from the rotational axis of the wheel 502. Similarly, when north poles of magnets 512 face away from the rotational axis of the wheel 502, north poles of the magnets 530 face the rotational axis of the wheel 502. Such orientations of the various magnets ensures that magnets 530 repel magnets 512, which may enable the wheel 502 to levitate about the magnets 530. In some embodiments, magnets 530 may be larger than magnets 512, which may enable fewer magnets 530 to be utilized while still providing sufficient magnetic force to levitate the wheel 502. In other embodiments, greater numbers of smaller magnets 530 may be utilized. The size and/or number of magnets 530 and/or magnets 512 may be selected to provide a desired amount of haptic feedback as the wheel 502 rotates (e.g., as gaps 514 pass by magnets 530), as well as to enable a desired amount (possibly none) of freewheeling, which may enable a user to quickly scroll the wheel 502 with one or more fast applications of force.

The magnets 530 may be fixed in position relative to the wheel 502 via one or more supports 520 that enable the wheel 502 to rotate about the magnets 530. In some embodiments, each magnet 530 may have a dedicated support 520, while in other embodiments (such as illustrated here) some or all of the magnets 530 share a single support 520 or set of supports 520. For example, as illustrated, the hubless scroll wheel 500 includes two supports 520, with one support 520 on either side of the wheel 502. Ends of each magnet 530 are coupled with the supports 520. The supports 520 may be spaced apart from lateral sides of the wheel 502 in some embodiments, while in other embodiments lateral sides of the wheel 502 may be in contact with one or both supports 520. In some such embodiments, at least a portion of the supports 520 that contact the wheel 502 may be formed from or include a low-friction and/or wear resistant material, such as (but not limited to) PTFE. In some embodiments, the supports 520 may not only support magnets 530 or other ratchet members 516, but may also constrain lateral movement of the wheel 502. As illustrated, the two supports 520 maintain three magnets 530 are substantially regular angular intervals (e.g., the magnets 530 are approximately 120 degrees apart). Supports 520 may be positioned entirely outward of the open interior 504, or a portion of one or more of the supports 520 may extend into the open interior 506. One or more sensors, such as magnetic field sensors, may be used to detect a magnitude, speed, and/or direction of rotation of the wheel 502 as described elsewhere herein.

Figure 6:
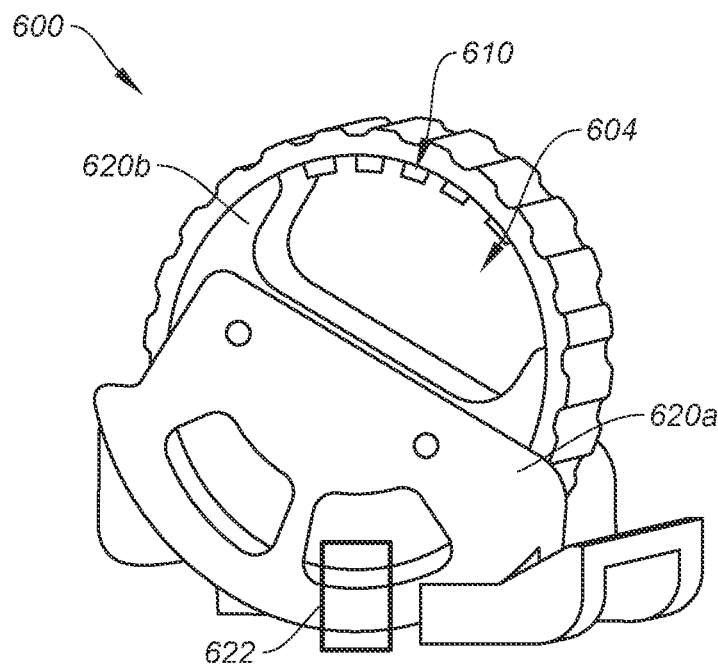
FIG. 6 illustrates an isometric view of a hubless scroll wheel according to embodiments of the present invention.
Figures 6A, 6B:
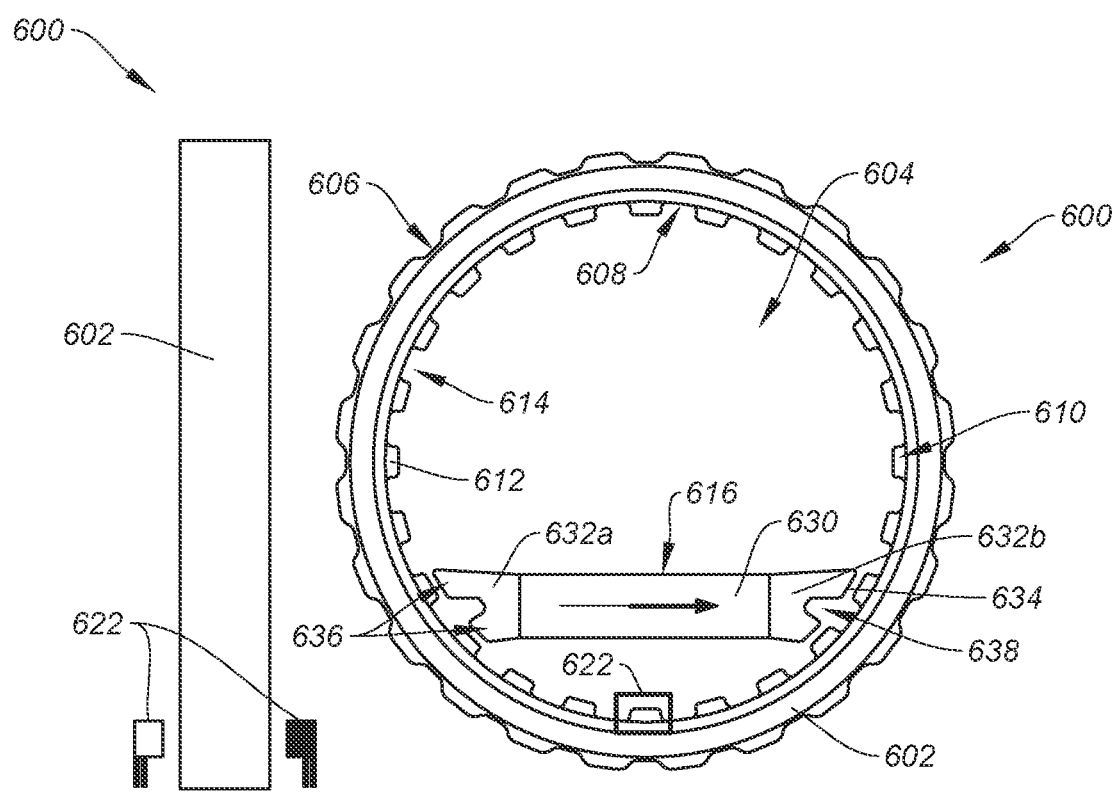
FIG. 6A illustrates a partial front elevation view of the hubless scroll wheel of FIG. 3.
FIG. 6B illustrates a partial cross-sectional side elevation view of the hubless scroll wheel of FIG. 6.

FIGS. 6-6B illustrate one embodiment of a hubless scroll wheel 600. Hubless scroll wheel 600 may be used in a peripheral device, such as peripheral device 100 described above. Hubless scroll wheel 600 may be similar to hubless scroll wheels 200, 300, 400, and 500 and may include any of the features described in relation to hubless scroll wheels 200, 300, 400, and 500. Hubless scroll wheel 600 may include a wheel 602 that defines an open interior 604. For example, the wheel 602 may be annular and may include an outer surface 606 and an inner surface 608, with the inner surface 608 defining a periphery of the open interior 204. In the illustrated embodiment, inner surface 608 defines a number of teeth 612 or other protrusions that are arranged at regular intervals and that may operate as indexing features 610. Adjacent teeth 612 may be separated by gaps 614, which may have a same width or different width than the teeth 612. While shown with teeth 612 being generally rectangular, it will be appreciated that teeth 612 may have other shapes in various embodiments. Teeth 612 may be used to provide haptic feedback to the user as the wheel 602 is rotated and/or that may be used by the hubless scroll wheel 600 and/or an associated peripheral device to track a direction, speed, and/or magnitude of rotation of the hubless scroll wheel 600, which may enable the hubless scroll wheel 600 to be used to provide inputs to a connected computing device. Any number of teeth 612 may be utilized, with greater numbers of teeth 612 providing greater number of ratchet locations. For example, the wheel 602 may include at least 10 teeth, at least 12 teeth, at least 14 teeth, at least 16 teeth, at least 18 teeth, at least 20 teeth, at least 22 teeth, at least 24 teeth, at least 26 teeth, at least 28 teeth, at least 30 teeth, or more.

In the present embodiment, each tooth 612 operates as a contactless indexing feature 610. For example, the teeth 612 may interact with one or more contactless ratchet members 616 disposed within the open interior 604 to provide haptic feedback to a user as the wheel 602 rotates. In such embodiments, the teeth 612 (and possibly other portions or all of wheel 602) may be formed from a ferromagnetic material. In the present embodiment, the ratchet members 616 include one or more magnets 630 that are positioned within the open interior 604. As illustrated, a single magnet 630 is disposed within the bottom half of the open interior 604. The magnet 630 may include a first ferromagnetic member 632a disposed at an end of a first pole of the magnet 630 and a second ferromagnetic member 632b disposed at an end of a second pole of the magnet 630. The ferromagnetic members 632 may concentrate or otherwise tune the magnetic field generated by the magnet 630 to largely attract only those teeth 612 aligned with a distal end 634 of each ferromagnetic member 632. In some embodiments, the distal ends 634 of each ferromagnetic member 632 may have widths that substantially match a width of each tooth 612, which may help ensure that the distal ends 634 may be fully aligned with a given tooth 612 as the wheel 602 is rotated. The distal ends 634 may include several prongs 636, with each prong 636 having a width that substantially matches a width of each tooth 612. The prongs 636 may be separated from one another by gaps 638, which may be sized to space the prongs 636 apart by a same or substantially same width as each gap 614 separating adjacent teeth 612. In the illustrated embodiments, the prongs 636 have different lengths, which may enable ends of each prong 636 to be spaced apart from a nearest tooth 612 by a same lateral distance. For example, prongs 636 closer to the center of the open interior 604 may be longer than prongs 636 closer to a bottom of the open interior 604. In some embodiments, the ends of each prong 636 may be tapered, which may enable a distance between the end of the prong 636 and a nearest tooth 612 may be substantially constant across a width of the prong 636 and/or tooth 612. While shown here having two prongs 636, it will be appreciated that any number of prongs 636 may be used. For example, each distal end 634 may include one or more prongs, two or more prongs, three or more prongs, four or more prongs, or more.

In some embodiments, the prongs 636 may be arranged about the open interior 604 such that at any given angular position of the wheel 602, either all prongs 636 are radially aligned with a tooth 612 or no prongs 636 are aligned with a tooth 612. Such a design may enhance the ratchet feel and ability to hold the wheel 602 in a given rotational position as will be discussed in greater detail below. The teeth 612 may be formed from a ferromagnetic material that is attracted to the magnet 630. As the wheel 602 is rotated relative to the magnet 630, the teeth 612 may be attracted to the magnet 630 (and prongs 636) as the teeth 612 pass in close proximity and/or are radially aligned with the prongs 636. The presence of gaps 614 between adjacent teeth 612 may enable the hubless scroll wheel 600 to deliver haptic feedback that mimics a clicking or ratcheting feel of a traditional mechanical scroll wheel. For example, as the wheel 602 is rotated, each prong 636 is alternatingly aligned with one of the teeth 612 followed by a respective gap 614. As noted above, the prongs 636 may be arranged such that either all prongs 636 or no prongs 636 are aligned with respective teeth 612 at a given rotational position of the wheel 602, which may enable the attractive forces between teeth 612 and prongs 636 to be synchronized such that a greatest attractive force occurs when each prong 636 is aligned with one of the teeth 612 and a lowest attractive force occurs when each prong 636 is aligned with one of the gaps 614. When the attractive force is lowest, a user may feel little to no resistance to rotational motion of the wheel 602, while a greater resistance will be felt when the attractive force is greatest. The alternating nature of the teeth 612 and gaps 614 may therefore provide an undulating force profile that creates a ratchet feel as the wheel 602 is rotated relative to the magnet 630.

The presence of gaps 614 may also enable the interaction between the teeth 612 and the prongs 636 to hold the wheel 602 in a given rotational position in the absence of rotational force applied by a user. For example, when no user force is applied to the wheel 602, magnetic force from a prong 636 nearest to each tooth 612 may rotate and/or hold the wheel 602 at a position in which the tooth 612 nearest to each prong 636 is radially aligned with the respective prong 636. In the absence of additional user force, the magnetic force between the teeth 612 and prongs 636 may hold the wheel 602 at such a rotational position.

The magnet 630 may be fixed in position relative to the wheel 602, enabling the wheel 602 to rotate about the magnet 630. For example, magnet 630 may be coupled with one or more supports 620. As illustrated, the hubless scroll wheel 600 includes two lateral supports 620, with one lateral support 620a on either side of the wheel 602. Lateral supports 620 may couple with a central support 620b (which may be similar to central support 420) that may hold the magnet 630 within the open interior 604 without contacting the inner surface 608. The lateral supports 620a may be coupled with the housing of a peripheral device and/or a component disposed within the housing and may support and suspend the central support 620b within the open interior 604. In some embodiments, a top end of each support 620 may terminate below a top end of the wheel 602. For example, the top end of the supports 620 may be disposed below a housing of a peripheral device, such as illustrated in the peripheral device 100 of FIG. 1. Such a design may enable the supports 620 to be hidden within an interior of the housing and may provide a cleaner aesthetic look. In particular, when the peripehral device is a computer mouse, the top end of one or more of the supports 620 may be tapered to generally follow a contour of the primary mouse buttons. For example, a rear end of the supports 620 may be higher than a front end of the supports 620, which may enable the supports 620 to support the magnet 630 and wheel 602 as high as possible without protruding out of the housing.

Hubless scroll wheel 600 may include one or more sensors 622 that may be configured to detect a magnitude, speed, and/or direction of rotation of the wheel 602 relative to the magnet 630 and housing of the peripheral device. The sensors 622 may take various forms, such as magnetic sensors, optical sensors, capacitive sensors, resistive sensors, and/or inductive sensors, although other sensor types may be used in various embodiments. For example, sensors 622 may include optical sensors (such as, but not limited to through-beam sensors, diffuse reflection sensors, retro-reflective sensors, cameras, and the like) that may detect movement of the wheel 602. For example, the optical sensors may be aligned with the inner surface 608 of the wheel such that as the wheel 602 rotates, the sensors 622 are able to detect when a tooth 612 or a gap 614 is positioned in front of each sensor 622. For example, a light source (such as a light-emitting diode (LED) using visible and/or infrared (IR) light, laser, and/or other light source) may be oriented to emit light to a lateral side of the wheel 602. The hubless scroll wheel 600 and/or peripheral device may determine a magnitude, speed, and/or direction of rotation of the wheel 602 is rotating based on detecting a timing and pattern of when the light passes through a gap 614 or is obstructed by a tooth 612. In some embodiments, a single optical sensor may be utilized to monitor a single position on the wheel 602, while in other embodiments, multiple optical sensors may be disposed about various angular positions of the wheel 602.

In some embodiments, the sensors 622 may include inductive sensors that may detect movement of the wheel 602. The inductive sensors may be aligned with the inner surface 608 of the wheel such that as the wheel 602 rotates, the sensors 622 are able to detect when a tooth 612 or a gap 614 is positioned in front of each sensor 622. For example, each inductive sensor may emit a magnetic field that is directed at a lateral side of the wheel 602. When a tooth 612 is aligned with the magnetic field, the tooth 612 will cause a change in the magnetic field, such as by affecting an oscillation amplitude of the magnetic field. When a gap 614 is aligned with the magnetic field, the gap may cause no change or a different change in the magnetic field. Thus, as the wheel rotates, the magnetic field emitted by the inductive sensor oscillates in a repeating pattern. The hubless scroll wheel 600 and/or peripheral device may monitor the changes in the magnetic field to determine a magnitude, speed, and/or direction of rotation of the wheel 602. In some embodiments, a single inductive sensor may be utilized to monitor a single position on the wheel 602, while in other embodiments, multiple inductive sensors may be disposed about various angular positions of the wheel 602.

Figure 7:
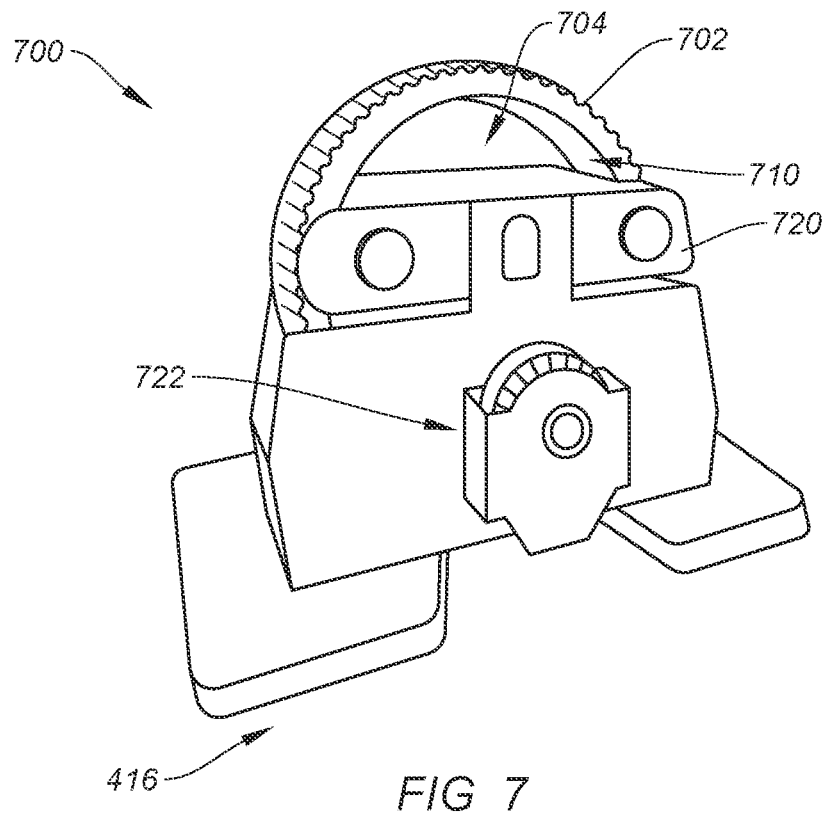
FIG. 7 illustrates a view of a hubless scroll wheel according to embodiments of the present invention.
Figure 7A:
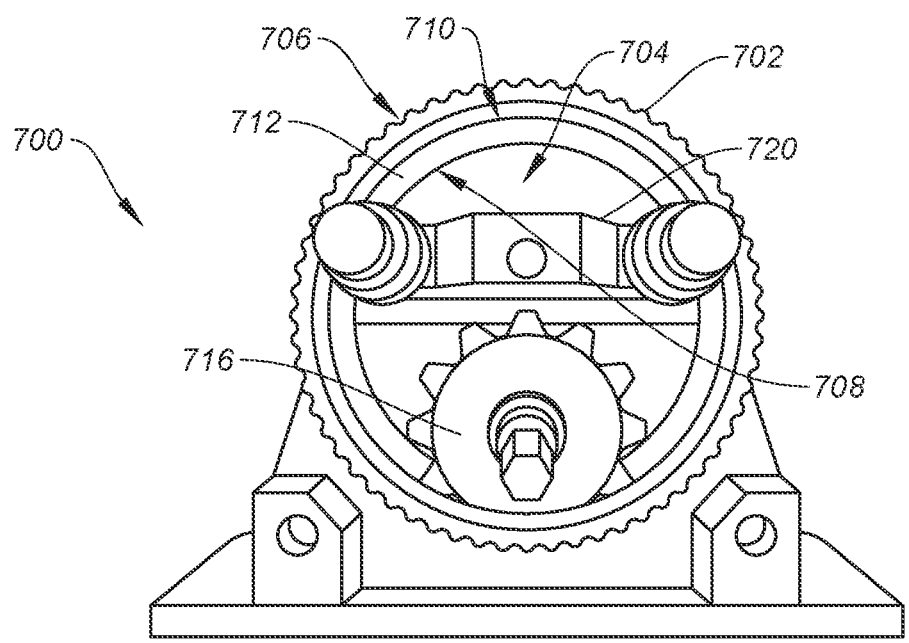
FIG. 7A illustrates a partial cross-sectional side elevation view of the hubless scroll wheel of FIG. 7.

FIGS. 7 and 7A illustrate one embodiment of a hubless scroll wheel 700. Hubless scroll wheel 700 may be used in a peripheral device, such as peripheral device 100 described above. Hubless scroll wheel 700 may be similar to hubless scroll wheels 200, 300, 400, 500, and 600 and may include any of the features described in relation to hubless scroll wheels 200, 300, 400, 500, and 600. Hubless scroll wheel 700 may include a wheel 702 that defines an open interior 704. For example, the wheel 702 may be annular and may include an outer surface 706 and an inner surface 708, with the inner surface 708 defining a periphery of the open interior 704. In the illustrated embodiment, inner surface 708 defines a number of gear teeth 712 that are arranged at regular intervals and that may operate as indexing features 710. Gear teeth 712 may be used to provide haptic feedback to the user as the wheel 702 is rotated and/or may be used by the hubless scroll wheel 700 and/or an associated peripheral device to track a direction, speed, and/or magnitude of rotation of the hubless scroll wheel 700, which may enable the hubless scroll wheel 700 to be used to provide inputs to a connected computing device. Any number of gear teeth 712 may be utilized, with greater numbers of gear teeth 712 providing greater number of ratchet locations. For example, the wheel 702 may include at least 10 gear teeth, at least 12 gear teeth, at least 14 gear teeth, at least 16 gear teeth, at least 18 gear teeth, at least 20 gear teeth, at least 22 gear teeth, at least 24 gear teeth, at least 26 gear teeth, at least 28 gear teeth, at least 30 gear teeth, or more.

Hubless scroll wheel 700 may include one or more gears 716 that may be disposed within the open interior 704, with teeth of the gear 716 being engaged with the gear teeth 712. As illustrated, three gears 716 are disposed within the open interior 704 although any number of gears may be used in various embodiments. For example, hubless scroll wheel 700 may include one or more gears, two or more gears, three or more gears, four or more gears, five or more gears, or more. The gears 716 may be disposed at regular or irregular intervals about the open interior 704. Engagement of the gear teeth 712 with gears 716 may provide a mechanical ratcheting feel as the wheel 702 is rotated. Additionally, engagement of the gear teeth 712 with gears 716 may hold the wheel 702 at a given rotational position when no user force is applied.

The gears 716 may be fixed in position relative to the wheel 702, enabling the wheel 702 to rotate about the gears 716. For example, the gears 716 may be coupled with one or more supports 720. As illustrated, the hubless scroll wheel 700 includes two lateral supports 720, with one lateral support 720 on either side of the wheel 702. Lateral supports 720 may be coupled with ends of an axle for each gear 716. The gears 716 may each be rotatably mounted on one of the axles, with the gears 716 being disposed within the open interior 704. In some embodiments, a top end of each support 720 may terminate below a top end of the wheel 702. For example, the top end of the supports 720 may be disposed below a housing of a peripheral device, such as illustrated in the peripheral device 100 of FIG. 1. Such a design may enable the supports 720 (and gears 716) to be hidden within an interior of the housing and may provide a cleaner aesthetic look.

Hubless scroll wheel 700 may include one or more sensors 722 that may be configured to detect a magnitude, speed, and/or direction of rotation of the wheel 702 relative to the gears 716 and housing of the peripheral device. The sensors 722 may take various forms, such as magnetic sensors, optical sensors, capacitive sensors, resistive sensors, and/or inductive sensors, although other sensor types may be used in various embodiments. For example, mechanical encoders may be used as sensors 722 in some embodiments. As illustrated, a mechanical encoder is rotatably coupled with one of the gear 716 (here, the lowest gear 716), although multiple gears 716 may be coupled with mechanical encoders in some embodiments. As the gear 716 rotates during rotation of the wheel 702, the gear 716 turns the mechanical encoder. Rotation of the mechanical encoder may be used by the hubless scroll wheel 700 and/or an associated peripheral device to determine a magnitude, speed, and/or direction of rotation of the wheel 702. In some embodiments, the mechanical encoder may be configured to generate haptic feedback in addition to or in place of haptic feedback generated by engagement of the gears 716 and the teeth 712.

In some embodiments, rather than or in addition to mechanical encoders, sensors 722 may include optical sensors that may detect movement of the wheel 702. For example, the optical sensors may be aligned with the inner surface 708 of the wheel such that as the wheel 702 rotates, the sensors 722 are able to detect when a gear tooth 712 or a gap between adjacent gear teeth 712 is positioned in front of each sensor 722. Similarly, the sensors 722 may include one or more inductive sensors that may detect movement of the wheel 702. The inductive sensors may be aligned with the inner surface 708 of the wheel such that as the wheel 702 rotates, the sensors 722 are able to detect when a gear tooth 712 or a gap between adjacent gear teeth 712 is positioned in front of each sensor 722. In such embodiments, gear teeth 712 may be formed from an electrically conductive material.

Figure 8A:
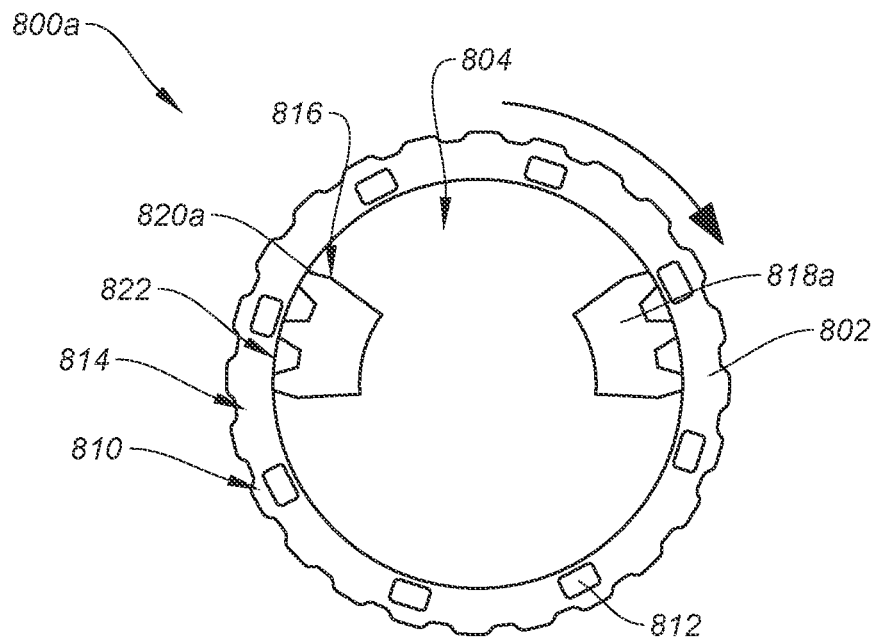
FIG. 8A illustrates a partial cross-sectional side elevation view of a hubless scroll wheel according to embodiments of the present invention.
Figure 8B:
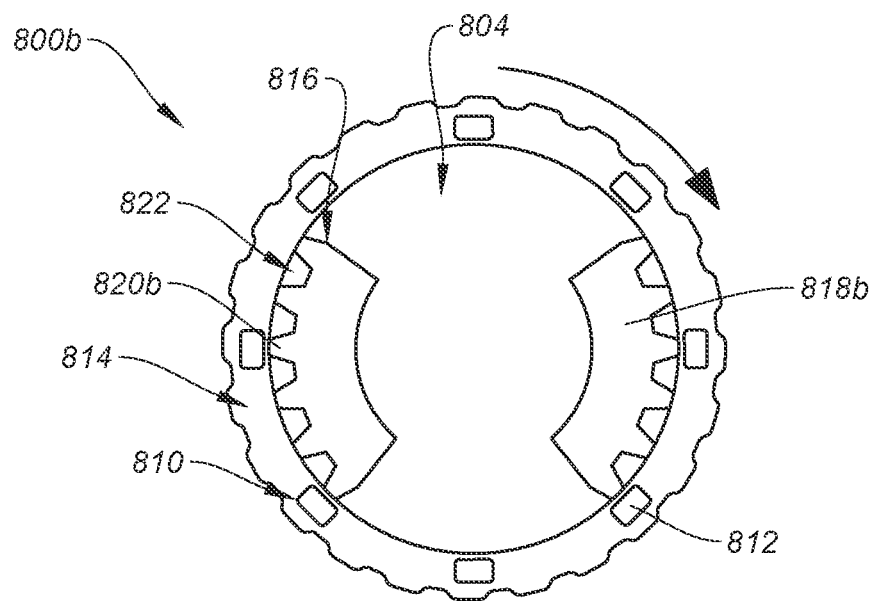
FIG. 8B illustrates a partial cross-sectional side elevation view of a hubless scroll wheel according to embodiments of the present invention.

FIGS. 8A and 8B illustrate portions of additional embodiments of hubless scroll wheels 800 in accordance with the present invention. Each hubless scroll wheel 800 may be used in a peripheral device, such as peripheral device 100 described above. Hubless scroll wheel 800 may be similar to hubless scroll wheels 200, 300, and 400 and may include any feature described in relation to hubless scroll wheels 200, 300, and 400. For example, each hubless scroll wheel 800 may include a wheel 802 that defines an open interior 804. A number of indexing features 810, such as magnets 812, may be disposed about the wheel 802 at different angular positions. As illustrated, the magnets 812 are disposed about the wheel 802 at regular angular intervals, with adjacent magnets 812 being separated from one another via gaps 814. Poles of each magnet 812 may be oriented in different arrangements, including those arrangements described in relation to hubless scroll wheels 200 and 300.

Hubless scroll wheel 800 may include one or more ratchet members 816, which may be ferromagnetic elements, such as arcuate members 818 that are positioned at different angular locations about an inner, outer, and/or lateral surface of wheel 802. The arcuate members 818 may each include one or more teeth 820, with adjacent teeth 820 being separated by gaps 822. The teeth 820 may provide stable positions for the wheel 802. For example, as the wheel 802 is rotated relative to the ratchet members 816, the teeth 820 of the arcuate members 818 may be attracted to the magnets 812 as the magnets 812 pass in close proximity to the teeth 820. The presence of gaps 814 between adjacent magnets 812 may enable the hubless scroll wheel 800 to deliver haptic feedback that mimics a clicking or ratcheting feel of a traditional mechanical scroll wheel. For example, as the wheel 802 is rotated, each tooth 820 is alternately aligned with one of the magnets 812 followed by a respective gap 814 to produce alternating periods of strong magnetic force and lesser/no magnetic force to provide a repeating ratchet feel as the wheel 802 is rotated relative to the ratchet members 816. The presence of gaps 814 may also enable the interaction between the magnets 812 and the teeth 820 to hold the wheel 802 in a given rotational position in the absence of rotational force applied by a user as described above. The use of arcuate members 818 having teeth 820 may enable fewer magnets 812 to be used, while providing a greater number of ratchet positions than a number of magnets 812. For example, eight magnets 812 and arcuate members 818 with three teeth 820 may result in 24 ratchet positions (e.g., 8×3).

The number of arcuate members 818 and teeth 820 on each arcuate member 818 may vary in different embodiments. For example, the hubless scroll wheel 800 may include one or more arcuate members, two or more arcuate members, three or more arcuate members, four or more acuate members, or more. In some embodiments in which a single arcuate member is included, the arcuate member may extend 360 degrees (e.g., is annular), while in other embodiments, the arcuate member may extend less than 360 degrees. In embodiments in which two or more arcuate members are included, each arcuate member may have a same or different size and/or number of teeth. A number of magnets 812 and a number of teeth 820 may be selected to produce a desired magnitude of haptic feedback. For example, a number and arrangement of magnets 812 and teeth 820 may be selected such that at all times, at least one magnet 812 is aligned with a respective tooth 820 (with the remaining magnets 812 being aligned with a gap 822 or positioned angularly outward of any arcuate members 818), at least two magnets 812 are aligned with teeth 820 (of one or more arcuate members 818), at least three magnets 812 are aligned with teeth 820, at least four magnets 812 are aligned with teeth 820, at least five magnets 812 are aligned with teeth 820, at least six magnets 812 are aligned with teeth 820, or more, with greater numbers of magnets 812 being in alignment with teeth 820 resulting in greater haptic forces. As just one example, a scroll wheel 800a may include eight magnets 812 and two arcuate members 818a at different angular positions about the wheel 802 as shown in FIG. 8A. Each arcuate member 818a may include three teeth 820a. The arcuate members 818a and magnets 812 may be arranged about the wheel 802 such that two magnets 812 are aligned with teeth 820a (e.g., one on each arcuate member 818a) at any given point in time. In another example, a scroll wheel 800b may include eight magnets 812 and two arcuate members 818b at different angular positions about the wheel 802 as shown in FIG. 8B. Each arcuate member 818b may include six teeth 820b. The arcuate members 818b and magnets 812 may be arranged about the wheel 802 such that four magnets 812 are aligned with teeth 820b (e.g., two on each arcuate member 818b) at any given point in time. Such an arrangement may produce twice the ratchet force as the embodiment of FIG. 8A, as there are double the number of magnets 812 in alignment with teeth 820. It will be appreciated that other numbers of magnets 812 and teeth 820 may be used to create other numbers of ratchet positions and/or other magnitudes of ratchet forces.

In some hubless scroll wheels, wheel guides (such as pins, rollers, or other contact members) may be positioned against (or proximate to) one or more surfaces of the wheel to help maintain the wheel in place on a peripheral device while permitting rotation of the wheel relative to the peripheral device. FIGS. 9A-9I illustrate different arrangements of using three wheel guides 904 to constrain vertical and/or lateral movement of a wheel 902 of a hubless scroll wheel 900. While shown with three wheel guides 904, it will be appreciated that more or fewer wheel guides 904 may be utilized in various embodiments. In some embodiments, the wheel 902 may be a solid wheel in which the wheel guides 904 are disposed on an inner and/or outer circumferential surface of the wheel 902. For example, in FIG. 9A, hubless scroll wheel 900a includes two wheel guides 904a that are disposed against an outer circumferential surface of the wheel 902a and one wheel guide 904a that is disposed against an inner circumferential surface of the wheel 902a. As illustrated, each of the wheel guides 904a is disposed proximate a bottom of the wheel 902a. For example, the inner wheel guide 904a may be positioned at approximately a bottom point of the inner circumferential surface of the wheel 902a (although other locations are possible), while the outer wheel guides 904a may be positioned on opposing sides of a bottom point of the outer circumferential surface of the wheel 902a, such as at equal distances from the bottom point.

Figure 9A:
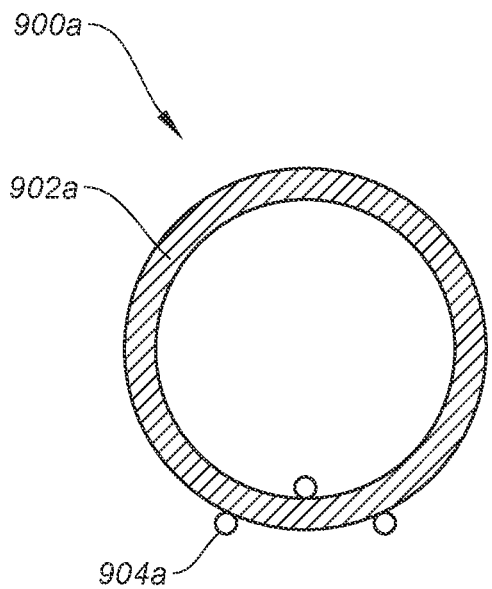
FIG. 9A illustrates a partial cross-sectional side elevation view of a wheel guide arrangement for a hubless scroll wheel according to embodiments of the present invention.
Figure 9B:
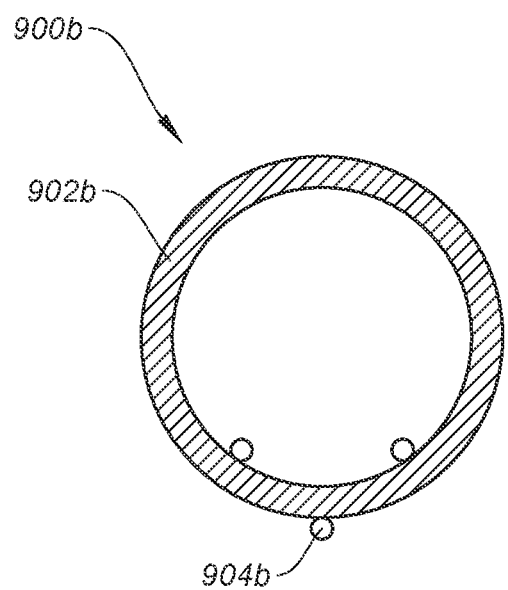
FIG. 9B illustrates a partial cross-sectional side elevation view of a wheel guide arrangement for a hubless scroll wheel according to embodiments of the present invention.
Figure 9C:
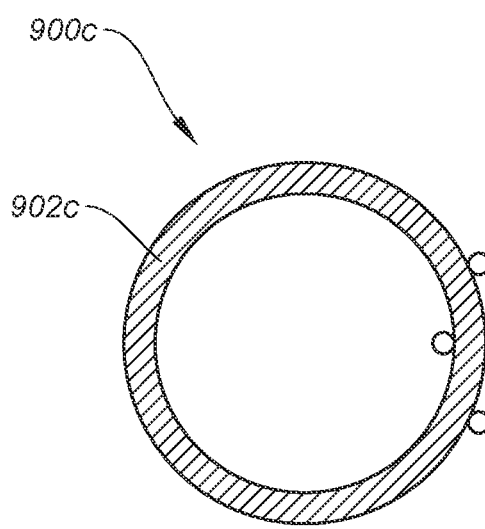
FIG. 9C illustrates a partial cross-sectional side elevation view of a wheel guide arrangement for a hubless scroll wheel according to embodiments of the present invention.
Figure 9D:
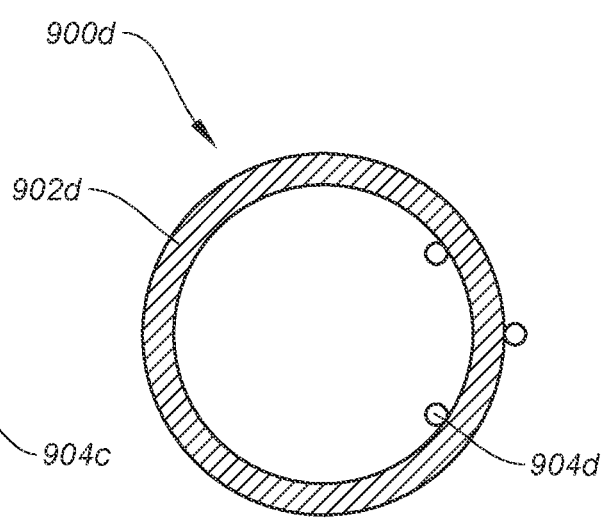
FIG. 9D illustrates a partial cross-sectional side elevation view of a wheel guide arrangement for a hubless scroll wheel according to embodiments of the present invention.

In FIG. 9B, hubless scroll wheel 900b includes one wheel guide 904b that is disposed against an outer circumferential surface of the wheel 902b and two wheel guides 904b that are disposed against an inner circumferential surface of the wheel 902b. As illustrated, each of the wheel guides 904b is disposed proximate a bottom of the wheel 902b. For example, the inner wheel guides 904b may be positioned on opposing sides of a bottom point of the inner circumferential surface of the wheel 902b, such as at equal distances from the bottom point, while the outer wheel guide 904b may be positioned at approximately a bottom point of the outer circumferential surface of the wheel 902b (although other locations are possible). In FIG. 9C, hubless scroll wheel 900c includes two wheel guides 904c that are disposed against an outer circumferential surface of the wheel 902c and one wheel guide 904c that is disposed against an inner circumferential surface of the wheel 902c. As illustrated, each of the wheel guides 904c is disposed proximate a lateral side of the wheel 902c. For example, the inner wheel guide 904c may be positioned at approximately an extreme lateral point of the inner circumferential surface of the wheel 902c (although other locations are possible), while the outer wheel guides 904c may be positioned on opposing sides of an extreme lateral point of the outer circumferential surface of the wheel 902c, such as at equal distances from the extreme lateral point. In FIG. 9D, hubless scroll wheel 900d includes one wheel guide 904d that is disposed against an outer circumferential surface of the wheel 902d and two wheel guides 904d that are disposed against an inner circumferential surface of the wheel 902d. As illustrated, each of the wheel guides 904d is disposed proximate an extreme lateral point of the wheel 902d. For example, the inner wheel guides 904d may be positioned on opposing sides of an extreme lateral point of the inner circumferential surface of the wheel 902d, such as at equal distances from the extreme lateral point, while the outer wheel guide 904d may be positioned at approximately an extreme lateral point of the outer circumferential surface of the wheel 902d (although other locations are possible).

Figure 9E:
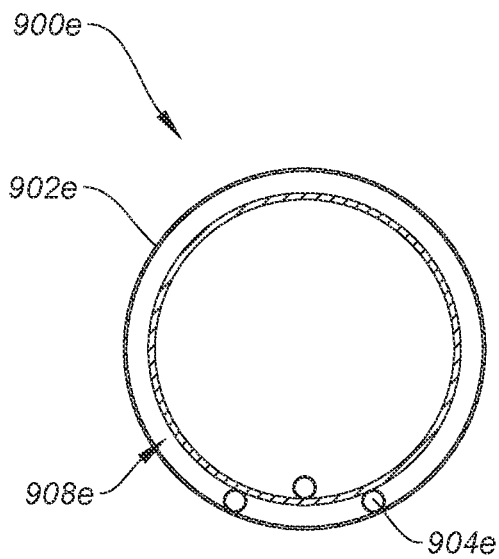
FIG. 9E illustrates a partial cross-sectional side elevation view of a wheel guide arrangement for a hubless scroll wheel according to embodiments of the present invention.

In some embodiments, the wheel 902 may include an annular track 908 or slot along one or both lateral surfaces of the wheel 902. The track 908 may enable some or all of the wheel guides 904 to be disposed within the track 908, although in some embodiments a track 908 may be included in a wheel 902 without any wheel guides 904 being disposed within the track 908. For example, the wheel guides 904 may be disposed against an inner and/or outer circumferential surface of the wheel 902 such as described in relation to FIGS. 9A-9D. In FIG. 9E, hubless scroll wheel 900e includes two wheel guides 904e that are disposed within the annular track 908e of the wheel 902e and one wheel guide 904e that is disposed against an inner circumferential surface of the wheel 902e. As illustrated, each of the wheel guides 904e is disposed proximate a bottom of the wheel 902e. For example, the inner wheel guide 904e may be positioned at approximately a bottom point of the inner circumferential surface of the wheel 902e (although other locations are possible), while the remaining wheel guides 904e may be positioned within the annular track 908e on opposing sides of a bottom point of the annular track 908e, such as at equal distances from the bottom point.

Figure 9F:
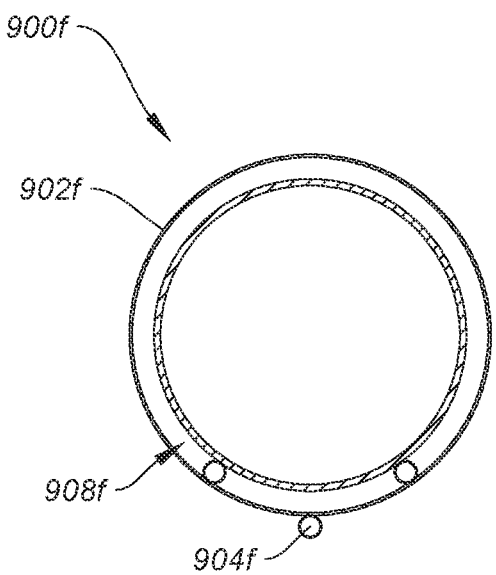
FIG. 9F illustrates a partial cross-sectional side elevation view of a wheel guide arrangement for a hubless scroll wheel according to embodiments of the present invention.
Figure 9G:
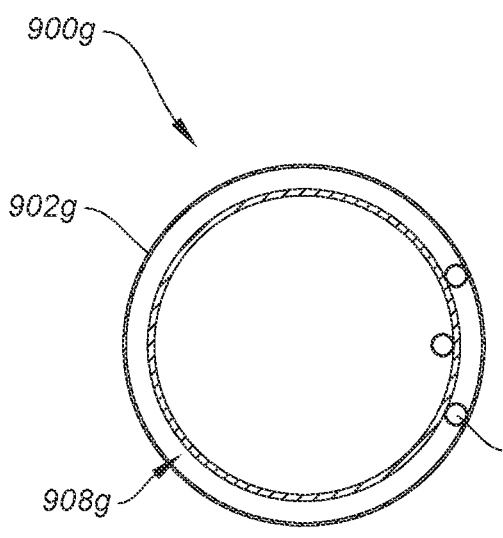
FIG. 9G illustrates a partial cross-sectional side elevation view of a wheel guide arrangement for a hubless scroll wheel according to embodiments of the present invention.
Figure 9H:
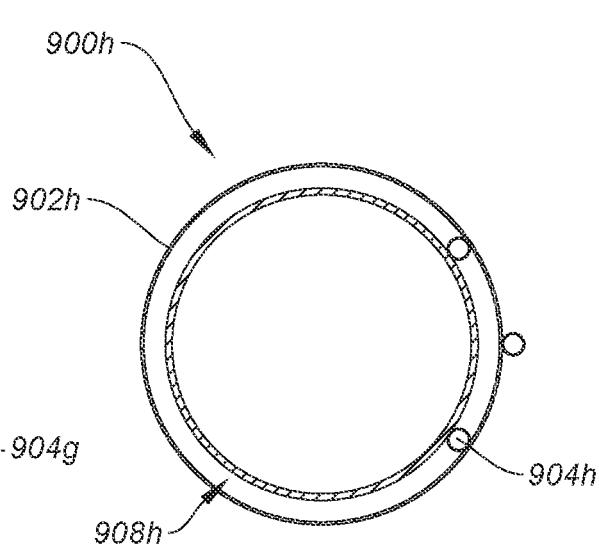
FIG. 9H illustrates a partial cross-sectional side elevation view of a wheel guide arrangement for a hubless scroll wheel according to embodiments of the present invention.

In FIG. 9F, hubless scroll wheel 900f includes one wheel guide 904f that is disposed against an outer circumferential surface of the wheel 902f and two wheel guides 904f that are disposed within the annular track 908f of the wheel 902f. As illustrated, each of the wheel guides 904f is disposed proximate a bottom of the wheel 902f. For example, the wheel guides 904f within the annular track 908f may be positioned on opposing sides of a bottom point of the annular track 908f, such as at equal distances from the bottom point, while the outer wheel guide 904f may be positioned at approximately a bottom point of the outer circumferential surface of the wheel 902f (although other locations are possible). In FIG. 9G, hubless scroll wheel 900g includes two wheel guides 904g that are disposed within the annular track 908g of the wheel 902g and one wheel guide 904g that is disposed against an inner circumferential surface of the wheel 902g. As illustrated, each of the wheel guides 904g is disposed proximate a lateral side of the wheel 902g. For example, the inner wheel guide 904g may be positioned at approximately an extreme lateral point of the inner circumferential surface of the wheel 902g (although other locations are possible), while the remaining wheel guides 904g may be positioned within the annular track 908g on opposing sides of an extreme lateral point of the annular track 908g, such as at equal distances from the extreme lateral point. In FIG. 9H, hubless scroll wheel 900h includes one wheel guide 904h that is disposed within the annular track 908h of the wheel 902h and two wheel guides 904h that are disposed against an inner circumferential surface of the wheel 902h. As illustrated, each of the wheel guides 904h is disposed proximate an extreme lateral point of the wheel 902h. For example, the inner wheel guides 904h may be positioned on opposing sides of an extreme lateral point of the inner circumferential surface of the wheel 902h, such as at equal distances from the extreme lateral point, while the remaining wheel guide 904h may be positioned at approximately an extreme lateral point of the annular track 908h (although other locations are possible).

Figure 9I:
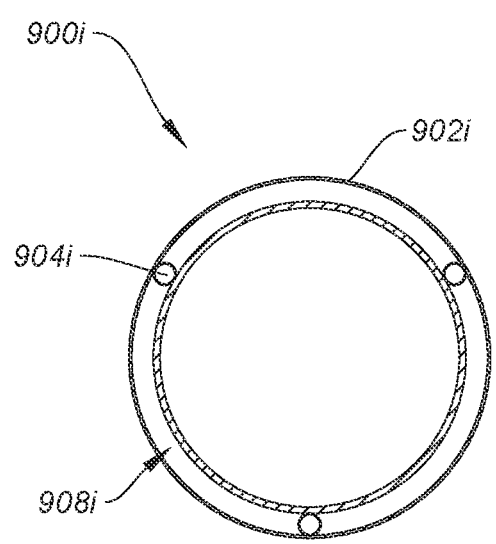
FIG. 9I illustrates a partial cross-sectional side elevation view of a wheel guide arrangement for a hubless scroll wheel according to embodiments of the present invention.

In FIG. 9I, hubless scroll wheel 900i includes three wheel guides 904i that are disposed within the annular track 908i of the wheel 902i. As illustrated, each of the wheel guides 904i is spaced equidistantly from one another (although other angular intervals are possible), with one of the wheel guides 904i being disposed proximate a bottom of the wheel 902i. It will be appreciated that the above arrangements of wheel guides 904 are merely provided as examples and that numerous variations exist. For example, any number and arrangement of wheel guides 904 that are positioned within an annular track 908 and/or against one of the outer or inner circumferential surface of the wheel 902 that constrains lateral and vertical movement of the wheel 902 while permitting rotation of the wheel 902 may be utilized.

Figure 10:
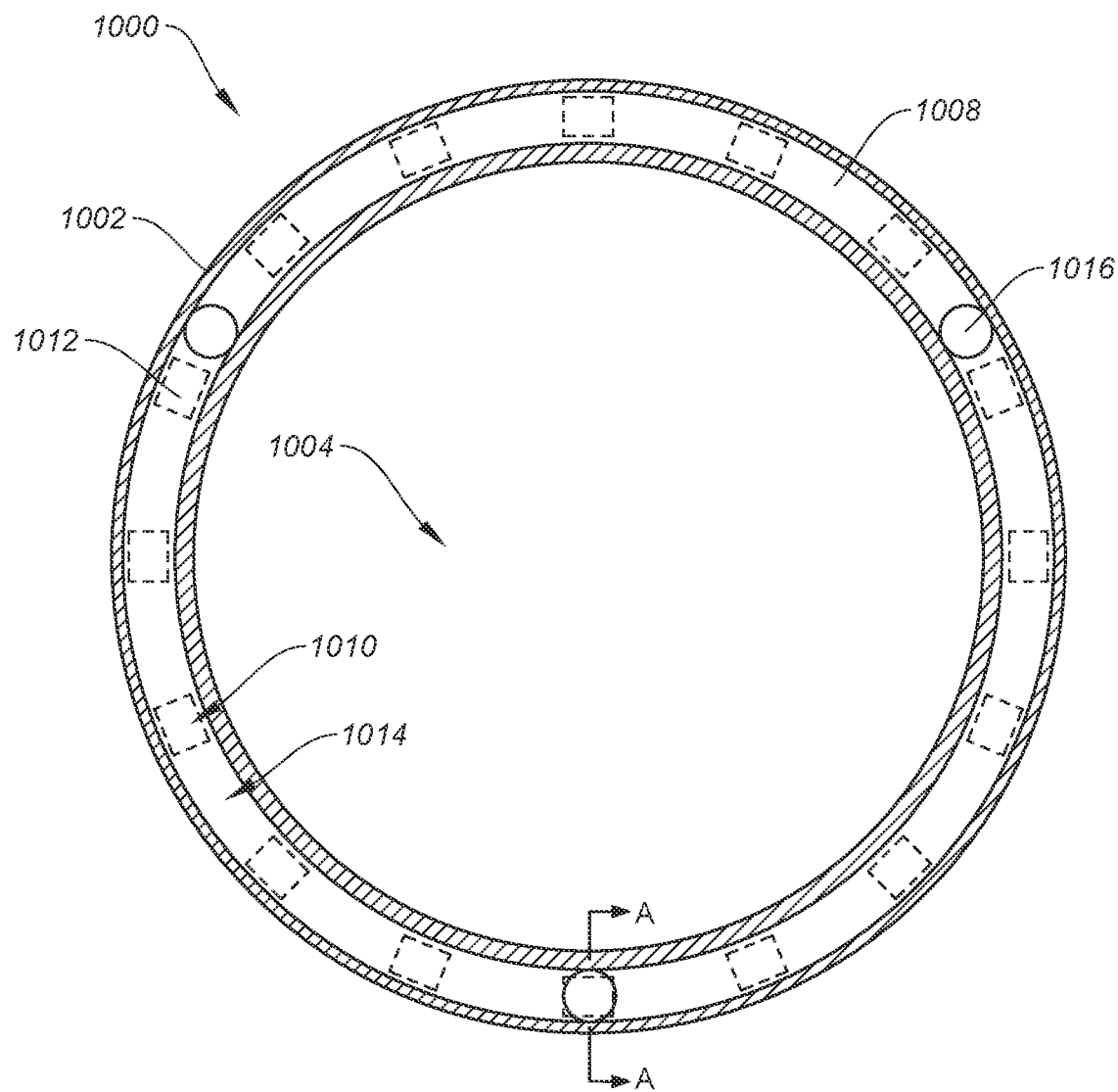
FIG. 10 illustrates a partial cross-sectional side elevation view of a hubless scroll wheel according to embodiments of the present invention.
Figure 10A:
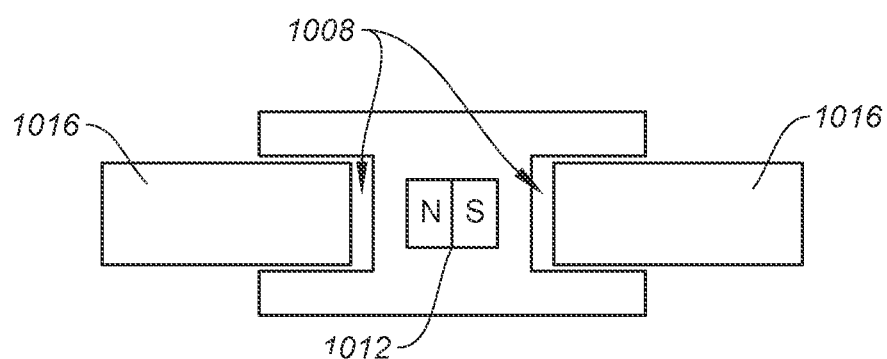
FIG. 10A illustrates a partial cross-sectional front elevation view of the hubless scroll wheel of FIG. 10 taken along line A-A.

FIGS. 10 and 10A illustrate portions of an additional embodiment of a hubless scroll wheel 1000 in accordance with the present invention. The hubless scroll wheel 1000 may be used in a peripheral device, such as peripheral device 100 described above. The hubless scroll wheel 1000 may be similar to hubless scroll wheels 200, 300, 400, 800, and 900 and may include any feature described in relation to hubless scroll wheels 200, 300, 400, 800, and 900. For example, the hubless scroll wheel 1000 may include a wheel 1002 that defines an open interior 1004. The wheel 1002 may define one or more annular tracks 1008 or slots along one or both lateral surfaces of the wheel 1002. A number of indexing features 1010, such as magnets 1012, may be disposed about the wheel 1002 at different angular positions. As illustrated, the magnets 1012 are disposed about the wheel 1002 at regular angular intervals, with adjacent magnets 1012 being separated from one another via gaps 1014. Rather than being oriented radially, poles of each magnet 1012 may be parallel to a rotational axis of the wheel 1002, with all of the poles being parallel to one another and arranged in an annular fashion about the wheel 1002. In some embodiments, the magnets 1012 may be aligned with the annular tracks 1008.

Hubless scroll wheel 1000 may include one or more ratchet members 1016, which may be ferromagnetic elements (such as fins, pins, or bars) that are positioned at different angular locations about one or both lateral surfaces of wheel 1002. For example, as best illustrated in FIG. 10A (which is a cross section taken through line A-A on FIG. 10), the ratchet members 1016 include pins that may each extend into one of the annular tracks 1008 while being disposed laterally outward of the indexing features 1010. The ratchet members 1016 may be contactless in some embodiments, with magnetic interactions between the magnets 1012 and the ferromagnetic elements of the ratchet members 1016 to produce haptic feedback that mimics a clicking or ratcheting feel of a traditional mechanical scroll wheel in a manner similar to that described in relation to the hubless scroll wheel 200. In some embodiments, in addition to providing the ratchet feel, each ratchet member 1016 may contact a surface of one of the annular tracks 1008 to act as a wheel guide (such as described in relation to FIGS. 9E-9I) to help support the wheel 1002 in a given position relative to the housing of a peripheral device, while still permitting rotation of the wheel 1002.

Figure 11:
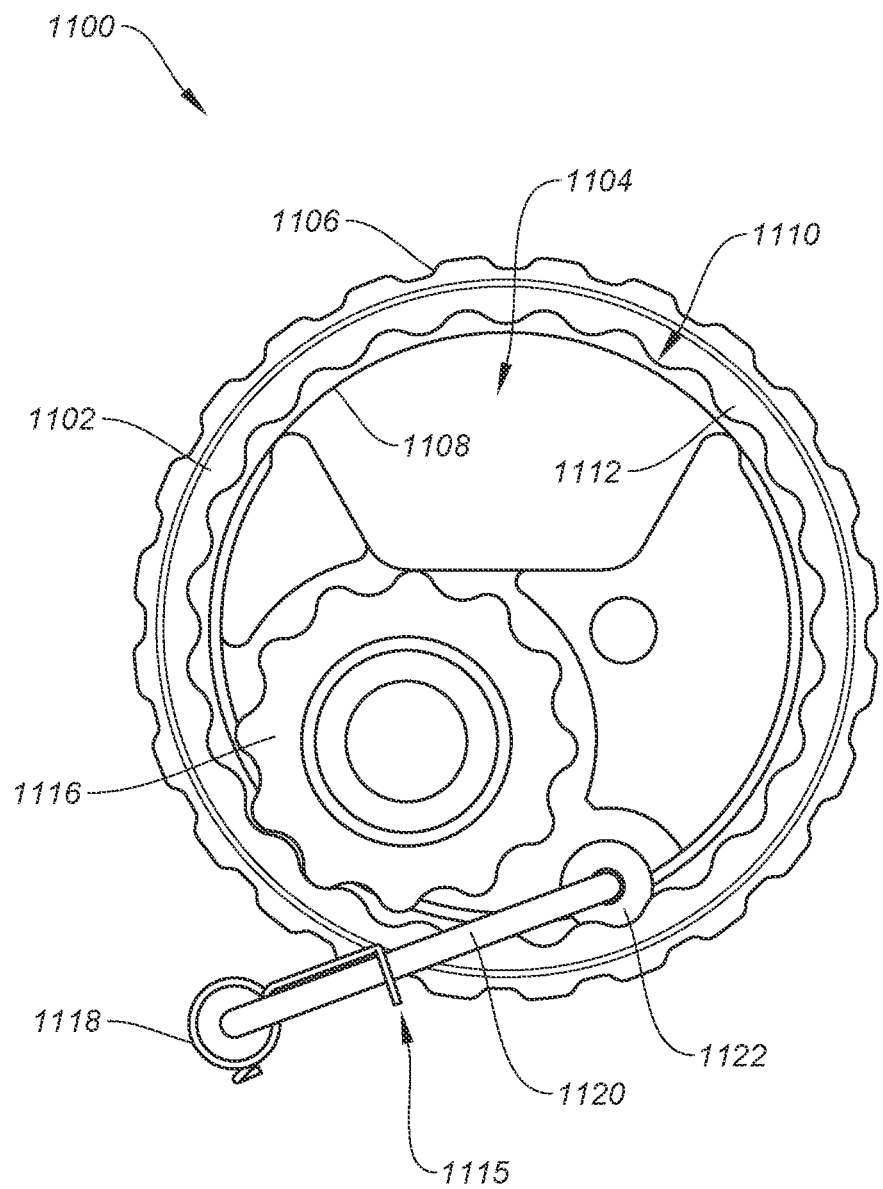
FIG. 11 illustrates a partial cross-sectional side elevation view of a hubless scroll wheel according to embodiments of the present invention.

FIG. 11 illustrates a portion of an additional embodiment of a hubless scroll wheel 1100 in accordance with the present invention. Each hubless scroll wheel 1100 may be used in a peripheral device, such as peripheral device 100 described above. Hubless scroll wheel 1100 may be similar to hubless scroll wheel 700 and may include any feature described in relation to hubless scroll wheel 700. For example, each hubless scroll wheel 1100 may include a wheel 1102 that defines an open interior 1104. For example, the wheel 1102 may be annular and may include an outer surface 1106 and an inner surface 1108, with the inner surface 1108 defining a periphery of the open interior 1104. In the illustrated embodiment, inner surface 1108 defines a number of gear teeth 1112 that are arranged at regular intervals and that may operate as indexing features 1110. Gear teeth 1112 may be used to provide haptic feedback to the user as the wheel 1102 is rotated and/or may be used by the hubless scroll wheel 1100 and/or an associated peripheral device to track a direction, speed, and/or magnitude of rotation of the hubless scroll wheel 1100, which may enable the hubless scroll wheel 1100 to be used to provide inputs to a connected computing device. Hubless scroll wheel 1100 may include one or more gears 1116 that may be disposed within the open interior 1104, with teeth of the gear 1116 being engaged with the gear teeth 1112. As illustrated, a single gear 1116 is disposed within the open interior 1104 although any number of gears may be used in various embodiments. The gear 1116 may be coupled with a sensor, such as a mechanical encoder, that may corotate with the gear 1116 to detect a magnitude, speed, and/or direction of rotation of the wheel 1102. In some embodiments, alternatively or in addition to the use of a mechanical encoder, the hubless scroll wheel 1100 may include one or more other sensors (such as magnetic sensors, optical sensors, capacitive sensors, resistive sensors, and/or inductive sensors) that are configured to detect a magnitude, speed, and/or direction of rotation of the wheel 1102 as described in relation to FIGS. 7 and 7A.

The hubless scroll wheel 1100 may include one or more ratchet members 1115 in some embodiments. For example, each ratchet member 1115 may be in the form of a spring-biased ratchet member that is positioned against a toothed surface of the wheel 1102. The toothed surface may be the inner circumferential surface of the wheel 1102 as shown here, with the toothed surface including the gear teeth 1112. In other embodiments, the toothed surface may be a lateral surface of the wheel 1102 and/or an outer circumferential surface of the wheel 1102 such that the teeth engaged by the ratchet member 1115 are different than the gear teeth 1112 engaged by the gear 1116. The ratchet member 1115 may include a spring 1118 and an arm 1120 that are coupled with a housing of a peripheral device (or other fixed component of the peripheral device). A distal end of the arm 1120 may be positioned proximate the toothed surface of the wheel 1102 and may include and/or be coupled with a contact member 1122. Thee contact member 1122 may be engaged with the toothed surface, such as by being positioned within a gap formed between two adjacent teeth (as illustrated, gaps between adjacent gear teeth 1116) of the toothed surface. For example, the contact member 1122 may be sized and/or shaped to correspond to the gap between adjacent teeth. As illustrated, the contact member 1122 is cylindrical. In a particular embodiment, the arm 1120 may be positioned laterally outward of the wheel 1102, with the contact member 1122 extending at an angle toward and into engagement with the toothed surface. The spring 1118 may bias the arm 1120 and the contact member 1122 toward the toothed surface. As the wheel 1102 is rotated, rotation of the toothed surface may cause the contact member 1122 to be forced out of a first gap by the rotating teeth, with the contact member 1122 being snapped or otherwise forced into a circumferentially adjacent gap by the force of the spring 1118 and arm 1120. As the contact member 1122 hits each rotating tooth, a ratcheting feel may be generated. A force of the spring 1118 may be selected to provide a desired magnitude of ratcheting force.

It will be appreciated that features of the various hubless scroll wheels described herein may be combined in different manners. As just one example, magnets may be embedded in a toothed wheel, enabling the use of a contactless ratcheting mechanism through the magnetic fields of the magnets of the wheel and magnets and/or ferromagnetic elements within the open interior, while also enabling the use of optical sensors, capacitive sensors, resistive sensors, and/or inductive sensors as described herein.

In some embodiments, additional functionality may be provided to any of the hubless scroll wheels described herein. For example, one or more switches and/or sensors may be positioned on the supports and/or housing to detect lateral forces applied to the hubless scroll wheel. In some embodiments, the supports and hubless scroll wheel may be mounted with a housing of a peripheral device such that the hubless scroll wheel may be depressed relative to the housing. For example, a spring-biased support may enable the wheel to be depressed to actuate a switch, which may enable the hubless scroll wheel to serve as a clickable input device in addition to a rotatable scroll wheel. Numerous other sensors, switches, and/or other functions may be incorporated into the hubless scroll wheels described herein.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of +20% or +10%, +5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, also encompasses variations of +20% or +10%, +5%, or +0.1% from the specified value, as such variations are appropriate to in the context of the systems, devices, circuits, methods, and other implementations described herein.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

What is claimed is:

1. A hubless scroll wheel for a computer peripheral device, comprising:
    a wheel defining an open interior, the wheel comprising a plurality of contactless indexing features positioned at different angular positions about the wheel;
    at least one fixed contactless ratchet member disposed proximate the wheel, wherein:
        the wheel is rotatable relative to the at least one fixed contactless ratchet member;
        each of the plurality of contactless indexing features and the at least one fixed contactless ratchet member comprises one or both of a magnet and a ferromagnetic material; and
        the at least one fixed contactless ratchet member is configured to interact with the plurality of contactless indexing features to produce a tactile response as the wheel is rotated relative to the at least one fixed contactless ratchet member; and
    at least one sensor that is configured to detect a magnitude and direction of rotation of the wheel relative to the at least one sensor.

2. The hubless scroll wheel for a computer peripheral device of claim 1, wherein:
    each of the plurality of contactless indexing features comprise a magnet; and
    each of the at least one fixed contactless ratchet member comprises a ferromagnetic element.

3. The hubless scroll wheel for a computer peripheral device of claim 2, wherein:
    each ferromagnetic element comprises a ferromagnetic pin that is rotatable about a pin axis.

4. The hubless scroll wheel for a computer peripheral device of claim 2, wherein:
    poles of each magnet are oriented in a same radial direction relative to an axis of rotation of the wheel.

5. The hubless scroll wheel for a computer peripheral device of claim 2, wherein:
    poles of each magnet on a first half of the wheel are oriented in a first radial direction relative to an axis of rotation of the wheel and poles of each magnet on a second half of the wheel are oriented in a second radial direction relative to an axis of rotation of the wheel.

6. The hubless scroll wheel for a computer peripheral device of claim 2, wherein:
    the at least one sensor comprises a Hall sensor.

7. The hubless scroll wheel for a computer peripheral device of claim 1, wherein:
    each of the plurality of contactless indexing features comprises a ferromagnetic tooth; and
    each of the at least one fixed contactless ratchet member comprises a magnet.

8. The hubless scroll wheel for a computer peripheral device of claim 7, wherein:
    the magnet comprises a first ferromagnetic member disposed at an end of a first pole of the magnet and a second ferromagnetic member disposed at an end of a second pole of the magnet; and
    distal ends of the first ferromagnetic member and the second ferromagnetic member have widths that substantially match a width of each ferromagnetic tooth.

9. The hubless scroll wheel for a computer peripheral device of claim 8, wherein:
    the at least one sensor comprises at least one of an optical sensor, an inductive sensor, a capacitive sensor, or a resistive sensor.

10. A peripheral device, comprising:
a housing;
at least one fixed contactless ratchet member coupled with the housing;
a wheel mount;
a wheel rotatably coupled with the wheel mount, wherein:
- the wheel defines an open interior within which the at least one fixed contactless ratchet member is disposed;
- the wheel comprises a plurality of contactless indexing features positioned at different angular positions about the wheel;
- the wheel is rotatable relative to the at least one fixed contactless ratchet member;
- each of the plurality of contactless indexing features and the at least one fixed contactless ratchet member comprises one or both of a magnet and a ferromagnetic material; and
- the at least one fixed contactless ratchet member is configured to interact with the plurality of contactless indexing features to produce a tactile response as the wheel is rotated relative to the at least one fixed contactless ratchet member; and at least one sensor that is configured to detect a magnitude and direction of rotation of the wheel.

11. The peripheral device of claim 10, wherein:
at least a portion of the open interior extends beyond an outer surface of the housing.

12. The peripheral device of claim 10, wherein:
each of the plurality of contactless indexing features comprises a magnet;
each of the at least one fixed contactless ratchet member comprises a ferromagnetic pin; and
poles of each magnet are oriented to create an attractive force with each ferromagnetic pin when the magnet is aligned with one of the ferromagnetic pins.

13. The peripheral device of claim 12, wherein:
the ferromagnetic pins contact an inner surface of the wheel.

14. The peripheral device of claim 12, wherein:
the at least one fixed contactless ratchet member comprises only two ferromagnetic pins that are disposed within 180 degrees of one another.

15. The peripheral device of claim 14, wherein:
the two ferromagnetic pins are disposed within an upper half of the open interior of the wheel.

16. A hubless scroll wheel for a computer peripheral device, comprising:
a wheel defining an open interior;
a plurality of contactless indexing features positioned at different angular positions about the wheel;
at least one fixed contactless ratchet member disposed proximate the wheel, wherein:
- the wheel is rotatable relative to the at least one fixed contactless ratchet member;
- each of the plurality of contactless indexing features and the at least one fixed contactless ratchet member comprises one or both of a magnet and a ferromagnetic material; and
- the at least one fixed contactless rachet member is configured to interact with the plurality of contactless indexing features to produce a tactile response as the wheel is rotated relative to the at least one fixed contactless ratchet member; and at least one sensor that is configured to detect a magnitude and direction of rotation of the wheel relative to the at least one sensor.

17. The hubless scroll wheel for a computer peripheral device of claim 16, wherein:
the at least one fixed contactless ratcheting member is coupled with the wheel.

18. The hubless scroll wheel for a computer peripheral device of claim 16, wherein:
each of the plurality of contactless indexing features comprises a magnet; and
each of the at least one fixed contactless ratchet member comprises an arcuate member that includes a plurality of teeth.

19. The hubless scroll wheel for a computer peripheral device of claim 16, wherein:
each of the plurality of contactless indexing features comprises a magnet;
each of the at least one fixed contactless ratchet member comprises a ferromagnetic member; and
poles of circumferentially adjacent magnets are oriented in opposite radial directions relative to an axis of rotation of the wheel.

20. The hubless scroll wheel for a computer peripheral device of claim 16, wherein:
each of the plurality of contactless indexing features comprises a magnet;
poles of each magnet are parallel to a rotational axis of the wheel; and
each of the at least one fixed contactless ratchet member comprises a ferromagnetic member that is disposed laterally outward of the plurality of contactless indexing features.

* * * * *